(12) United States Patent
Habib et al.

(10) Patent No.: US 7,884,599 B2
(45) Date of Patent: Feb. 8, 2011

(54) HDL DESIGN STRUCTURE FOR INTEGRATING TEST STRUCTURES INTO AN INTEGRATED CIRCUIT DESIGN

(75) Inventors: Nazmul Habib, South Burlington, VT (US); Robert McMahon, Essex Junction, VT (US); Troy Perry, Georgia, VT (US)

(73) Assignee: International Business Machines Corporation, Armonk, NY (US)

( * ) Notice: Subject to any disclaimer, the term of this patent is extended or adjusted under 35 U.S.C. 154(b) by 367 days.

(21) Appl. No.: 12/106,361

(22) Filed: Apr. 21, 2008

(65) Prior Publication Data

US 2008/0189671 A1 Aug. 7, 2008

Related U.S. Application Data

(63) Continuation-in-part of application No. 11/459,367, filed on Jul. 24, 2006, now Pat. No. 7,382,149.

(51) Int. Cl.
*G01R 31/28* (2006.01)
(52) U.S. Cl. .................................. 324/158.1
(58) Field of Classification Search ............... 324/765, 324/769, 763, 158.1; 716/1, 4, 5; 702/35–36, 702/85, 106, 182, 117; 714/724
See application file for complete search history.

(56) References Cited

U.S. PATENT DOCUMENTS

| | | | |
|---|---|---|---|
| 6,634,004 B1 | 10/2003 | Yamada et al. | |
| 6,784,686 B2 * | 8/2004 | Nishida et al. | ............... 324/765 |
| 6,988,229 B1 | 1/2006 | Folea | |
| 7,032,096 B2 | 4/2006 | Haas et al. | |
| 7,197,726 B2 | 3/2007 | Ciplickas et al. | |
| 7,299,389 B2 * | 11/2007 | Nishida et al. | ............... 714/724 |
| 7,382,149 B2 | 6/2008 | Anand et al. | |
| 7,487,477 B2 | 2/2009 | Bickford et al. | |
| 7,512,915 B2 | 3/2009 | Anand et al. | |
| 7,560,946 B2 | 7/2009 | Bickford et al. | |
| 2007/0261009 A1 | 11/2007 | Granicher et al. | |
| 2008/0099762 A1 | 5/2008 | Garcia et al. | |
| 2008/0189671 A1 | 8/2008 | Habib et al. | |
| 2008/0222584 A1 | 9/2008 | Habib et al. | |
| 2008/0231307 A1 | 9/2008 | Bickford et al. | |
| 2008/0244475 A1 | 10/2008 | Lo et al. | |
| 2008/0270954 A1 | 10/2008 | Habib et al. | |

* cited by examiner

*Primary Examiner*—Ha Tran T Nguyen
*Assistant Examiner*—Tung X Nguyen
(74) *Attorney, Agent, or Firm*—David Cain

(57) ABSTRACT

A hardware description language (HDL) design structure for performing device-specific testing and acquiring parametric data on integrated circuits, such that each chip can be tested individually without excessive test time requirements, additional silicon, or special test equipment. The HDL design structure includes a functional representation of at least one device test structure integrated into an IC design which tests a set of dummy devices that are identical or nearly identical to a selected set of devices contained in the IC. The test structures are integrated from a device under test (DUT) library according to customer requirements and design requirements. The functional representations of selected test structures are further prioritized and assigned to design elements within the design in order of priority. Placement algorithms use design, layout, and manufacturing requirements to place the selected functional representations of test structures into the final layout of the design.

10 Claims, 27 Drawing Sheets

Placement Options Table 2300

|  | 1200a | 1200b | 1200c |
|---|---|---|---|
| TS3 | 1800a, 1800b, 1800i | 1800b, 1800c', 1800d' | 1800k, 1800f, 1800g' |
| TS1 (Control Structure) | 1800a', 1800j' | 1800c', 1800d' | 1800g' |
| DUT 3 | 1800i | 1800b | 1800k |
| DUT 50 | 1800i, 1800j | 1800c, 1800d' | 1800m |
| DUT 2 | 1800a' | 1800b, 1800d | 1800k', 1800m' |
| DUT 1 | 1800a' | - | 1800k', 1800m' |
| TS2 | 1800a', 1800j', 1800i' | 1800b, 1800c' | 1800m, 1800g, 1800k', 1800f' |
| TS4 | - | - | - |

Test Structure Assignment List
935

| | 1 | 2 | 3 |
|---|---|---|---|
| TS3 | 1800a | 1800b (Share with TS2) | 1800k |
| TS1 | 1800j | 1800d | - |
| DUT 1 | 1800i | 1800b | - |
| DUT 2 | 1800i | 1800c | - |
| DUT 3 | 1800a | 1800d | - |
| DUT 4 | 1800a | Tie Off | - |
| TS2 | - | 1800b (share with TS3) | - |
| TS4 (Add to unused test structures 945) | - | - | - |

HDL DESIGN STRUCTURE FOR INTEGRATING TEST STRUCTURES INTO AN INTEGRATED CIRCUIT DESIGN

CROSS REFERENCES RELATED TO THE APPLICATION

This application is a continuation in part of U.S. application Ser. No. 11/459,367, filed Jul. 24, 2006, now U.S. Pat. No. 7,382,149 which is further related to pending U.S. application Ser. No. 11/859,965 filed Sep. 24, 2007, pending U.S. patent application Ser. No. 11/739,819 filed Apr. 25, 2007, and Ser. No. 12/106,373, all assigned to the present assignee.

BACKGROUND OF THE INVENTION

1. Field of the Invention

The invention relates to the field of designing a system and method for acquiring manufacturing process data on a part-by-part basis (e.g. chip), and more specifically, to providing a means to integrate the design structure into a second design structure.

2. Background of the Invention

Due to the complex and precise nature of semiconductor manufacturing, it is critical to ensure that all processes in the manufacturing line are within required specifications. This ensures the highest product yield. Monitoring the manufacturing process and correcting for deficiencies is critical for maintaining the health of the line (HOL).

Some testing is done in-line during manufacturing to tune the process real-time, and other tests are performed after manufacturing. Kerf testing is a common type of testing and provides information for a group of die on a wafer relating to process, voltage, and temperature (PVT). Other tests include: I/O receiver/driver levels, performance screen ring oscillator (PSRO) testing, and MUX scan testing, also known as "at speed" testing.

The problem with kerf testing is that it does not provide detailed information specific to each die on the wafer and further, cannot provide information about the electrical parameters of certain devices within each of the chips; especially custom designs which have smaller manufacturing lot sizes, device dimensions which vary from standard devices, and other product-specific qualities.

Since in-line testing is time consuming and expensive, it is important to perform adequate testing within a minimal amount of time. Generally, testing is done by sampling a set of kerfs to obtain an overall HOL measurement. For customized circuits, such as application specific integrated circuits (ASIC) testing by sampling does not provide an accurate assessment of device parameters within each die of the wafer. Maintaining device parameters within specifications is critical for improving yield and ensuring that customer requirements and delivery expectations are met.

BRIEF SUMMARY OF THE INVENTION

Based on the issues identified above, what is needed is a means for accurately testing customized circuitry so that adequate feedback can be relayed to the manufacturing line to ensure the highest possible yields. It is a further requirement that the testing process does not take an exceptional amount of time, nor take excessive silicon real estate and therefore, affect cost. The testing process must be adaptable to meet specific testing requirements without providing unnecessary test structure overhead.

An embodiment of the present invention describes an example of how a fabless IP design house would design and integrate the system described herein into one of its products.

An embodiment of the present invention is a system and method of integrating a test structure into a physical integrated circuit design (i.e. into a netlist), typically in the backfill. The test structure and corresponding system provides accurate electrical and physical measurements of the circuit and its devices on an associated die. Test structure 100 is shown in FIG. 1 and includes a logic controller 110 having a decoder for activating one or more device under test (DUT) structures 170, a decode level translator (DLT) 120, which provides a required logic level or required voltage to one or more DUT structures 170 or 180, and a protection circuit which isolates the integrated circuit when the test system is inactive.

Test structure 100 may operate in either a single or dual supply mode. In the single supply mode, during wafer final test (WFT) and/or module final test (MFT), the current ($I_{on}$) measurement for each DUT 170 is calculated and recorded. In dual supply mode, a control structure 190 controls the voltage to a DUT 170 gate, for example, as well as provides power to the DUT 170 source and/or drain. Measurements for threshold voltage ($V_t$), $I_{on}$, and effective current ($I_{eff}$) for each DUT 170 are then calculated and recorded.

Test structure 100 is a device performance monitor within application specific integrated circuits (ASIC). The macro represents all device types and design points used on an ASIC chip. Test structure 100 may be, for example, integrated with the existing electronic chip identification macro (ECID: used at IBM) or placed near a performance screen ring oscillator (PSRO), placed as a standalone macro, or placed non-contiguously such that control structure 190 is placed in a physically separate location on a chip from DUTs 170.

Test structure 100 provides several unique, user-defined device tests. All tests include measuring and recording applicable parameters of on-chip devices such as average $I_{on}$, $V_t$, and $I_{eff}$ pertaining to an array of FETs. The tests account for spatial variations. Each DUT 170 in this specification refers to but is not limited to nFET or pFET devices. DUTs 170 may also be wires, resistors, capacitors, inductors, and other circuit components. Additionally, across chip variation (ACV) data can be extracted and analyzed by placing multiple test structures 100 on a single chip.

During release checking, all device types and design points on a particular IC chip are determined and matched with those present in a test structure 100. If test structure 100 contains DUTs 170 that are not part of the IC design, then that test structure 100 will not be included in the design. Test structure 100 must not drive unique mask requirements. Only test structures 100 which are compatible with the IC will be chosen. Information describing what is both on the chip and in test structure 100 will be relayed to the manufacturing and test engineers.

Test structures 100 may be integrated into the design and coupled to existing ECID macros, which contain at least one fatwire I/O with very low-resistance requirements (<10 Ohms guaranteed). The fatwire I/O is connected to a Precision Measurement Unit (PMU) at test which will be used for accurate voltage force and current measure activity.

Determination for the number, type, location, and routing of required test structures 100 per chip is defined during the chip design process. Customer directives, internal rules, and historical data provide requirements for selection, synthesis, and placement of the test structures 100. These requirements include, but are not limited to: available backfill, distance from the fatwire I/O, proximity to critical logic macros, e.g.

PSROs used to guarantee product performance, continuity of test structures 100, desired test data for analysis, and minimum distances between test structures 100 for the design. One of ordinary skill in the art can appreciate the many requirements and specifications that must be maintained and adhered to in the design and manufacture of ICs.

The process of integrating test structures 100 into a customer design (e.g. netlist) includes identifying discrete elements within the design and comparing a library of test structures 100, each having varying DUTs 170. Test structures 100 which match various discrete elements are stored in a list. The list is further prioritized according to requirements including but not limited to: customer directives, internal rules, and historical data. A data structure comprising available fatwire I/O and other elements along with possible placement blocks (e.g. areas) on the die for test structures 100 is used to process and assign the prioritized list of test structures 100 to optimum elements and placement areas to the extent possible. Test structures 100 which are placeable, are synthesized in the netlist and placed using place and route tools. Final design checking is performed to ensure compliance with DFM rules. Test structures 100 that cause failures are removed from the netlist, the netlist resynthesized and checked. The process iterates until all DFM tests pass. The final netlist is recorded as a data structure, which is then released to manufacturing (i.e. tape-out) for example, as a GDSII file.

DETAILED DESCRIPTION OF THE INVENTION

Figure 1:
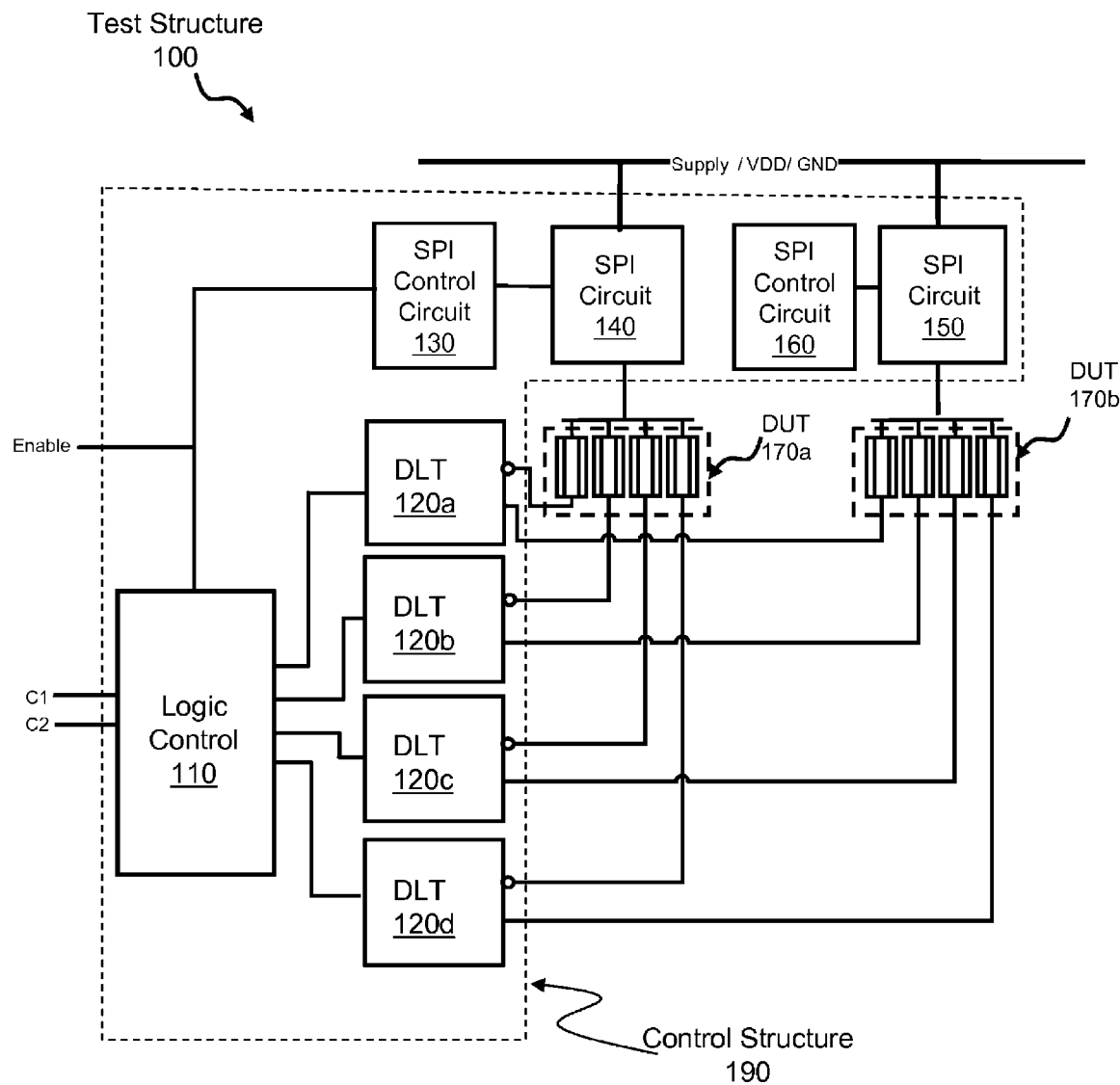
FIG. 1 is a system level block diagram of a test structure.

FIG. 1 shows a test structure 100 of one embodiment of the invention. Test structure 100 includes a control structure 190, which further includes logic control 110, a group of decode level translators (DLT) 120a-d (four DLTs are shown in this example), a pFET SPI circuit 140 coupled to an SPI control circuit 130, and an nFET SPI circuit 150 coupled to SPI control circuit 160. Test structure 100 further includes a DUT 170a, which represents one device type (in this example, an array of pFETs) and a DUT 170b, which represents a second device type (in this example, an array of nFETs). Each of DUTs 170 are coupled to control structure 190.

In operation, control structure 190 exercises corresponding DUTs 170 and provides resulting test data to a test apparatus (not shown). Each element of test structure 100 is further discussed in the following figures.

Figure 2:
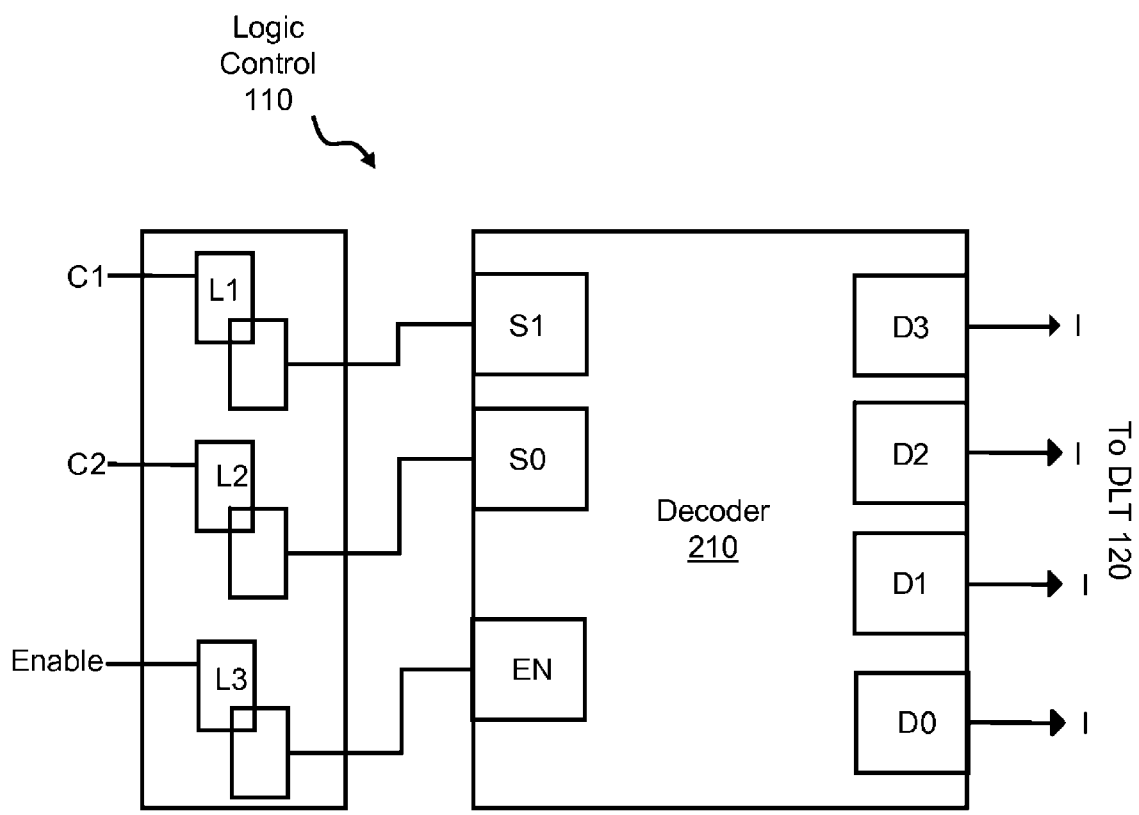
FIG. 2 is a block diagram of the logic control.

FIG. 2 shows logic control 110, which includes a control signal C1 coupled to a latch L1, which is further connected to a pad S1 of a decoder 210. Control signal C2 is coupled to a latch L2, the output of which is coupled to a pad S0 of decoder 210. An enable signal, EN, is coupled to a third latch L3, the output of which is coupled to a pad EN of decoder 210. Decoder 210 further comprises a series of outputs D0-D3, which are each coupled to DLT 120a-d respectively.

Logic control 110 enables each DUT 170 (e.g. 170a, 170b) to be activated individually for test. Decoder 210 is shown in FIG. 2 as a 2:4 decoder for illustrative purposes but need not be limited to a 2:4 decoder. Since DUT 170 experiments are separated, decoder 210 behaves as a 2 to 8 decoder, controlling DUTs 170 with each decoder output. Typical decode sizes will be 4:16 or 5:32, which will achieve capability of controlling 32 to 64 DUTs. If EN is low, decoder 210 outputs D0-D3 will be low, which ensures all DUT 170 gates are off.

Figure 3:
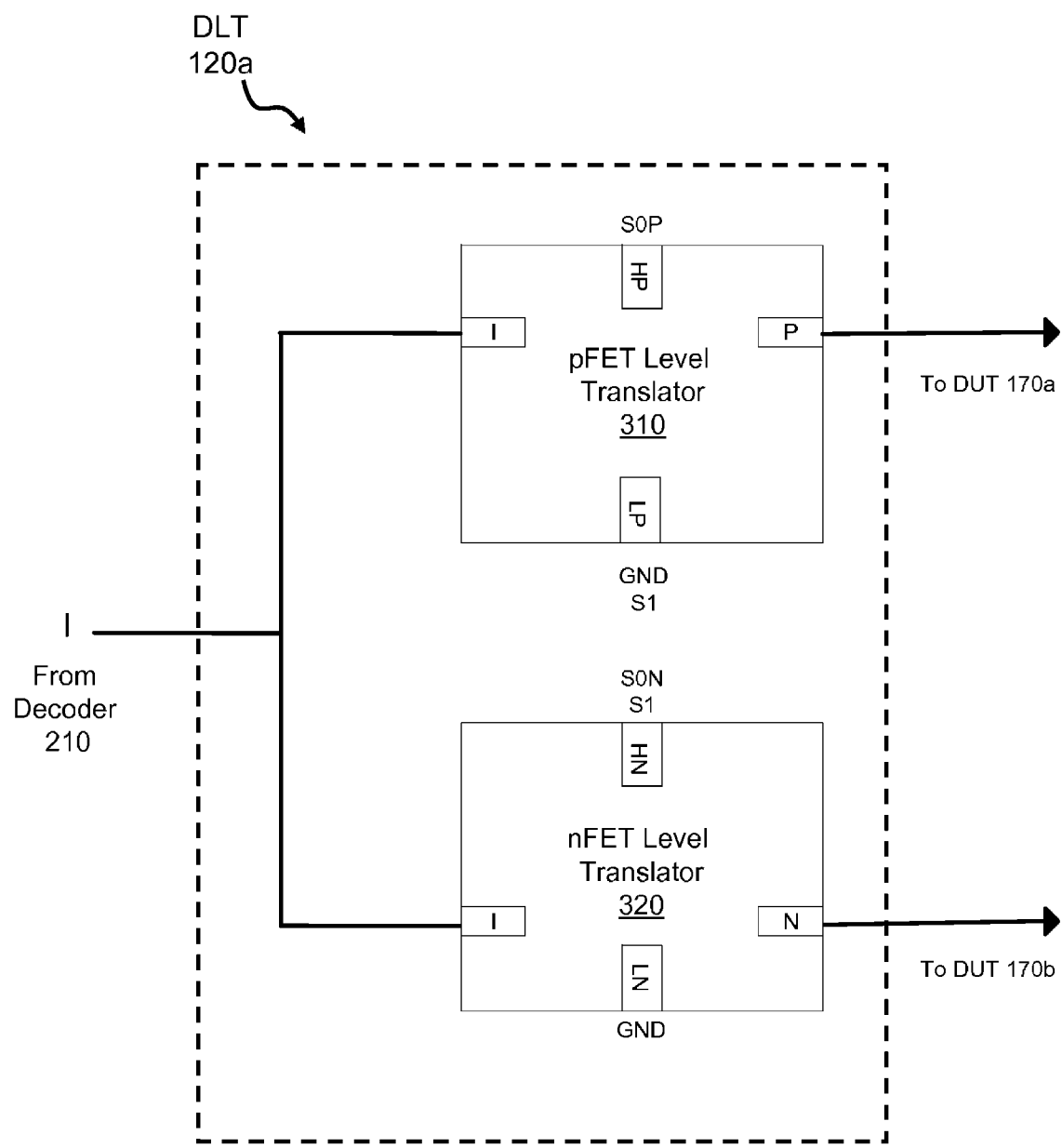
FIG. 3 is a block diagram of the decode level translator (DLT).

FIG. 3 shows a detailed diagram of DLT 120a. DLT 120a is exemplary of any of DLT 120b-d and thus will serve to explain DLT 120 functionality and structure by way of example. DLT 120a includes an input signal, I, from output D3 of decoder 210, a pFET level translator 310, and an nFET level translator 320. pFET level translator 310, further includes an input pad, I, an output pad, P, which is coupled to DUT 170, a second input pad, HP, and a third input pad, LP. nFET level translator 320 includes an input pad, I, which activates/deactivates DLT 120a, an output pad, N, which is coupled to DUT 180, a second input pad, HN, and a third input pad, LN. pFET level translator 310 and nFET level translator 320 are shown in detail in FIGS. 4 and 5 respectively.

In operation, input I to DLT 120a comes from decoder 210. When the output signal D3 from decoder 210, which is connected to the I pin of DLT 120a, is high, the P and N outputs of DLT 120a are active (i.e. N=1, and P=0), which turns on the associated DUT 170 gates. The supply voltage inputs to DLT 120a are shown in Table 1 below.

TABLE 1 values of HP, LP, HN and LN for single and dual supply modes

|    | Single | Dual |
|----|--------|------|
| HP | S0P    | S0P  |
| LP | GND    | S1   |
| HN | S0N    | S1   |
| LN | GND    | GND  |

In Table 1, "single" supply represents DUT 170 input from a single voltage source (S0P, S0N) which will drive simple logic 1's and 0's to DUT 170a and DUT 170b respectively.

In Table 1, "dual" represents input from two distinct voltage supplies where HN on nFET level translator 320 receives the signal S1 and LP on pFET level translator 310 also receives the signal S1.

In dual supply mode, S1 is sent to the gates of DUT 170a and 170b from outputs P and N respectively. S1 can be swept to determine the switching voltage ($V_{th}$) and FET current ($I_{ON}$) of DUT 170a and DUT 170b.

In general, DLT 120 enables logic control 110 to control DUTs 170 residing in different voltage realms. DLT 120 provides a means for communication between two voltage domains including Vdd, supplied to control logic 110, and test structure "Supply/VDD/GND" used to generate S0 for DLT 120. The purpose of DLT 120 is to provide accurate logic levels and/or analog gate voltages to DUTs 170 in order to perform device level testing. In the case of BEOL characterization, either nFET level translator 320 or pFET level translator 310 will be used, depending on the FET type used to control DUT 120. Equalizing DUT experiments (equal n and p experiments) optimize use of the test structure.

Figure 4:
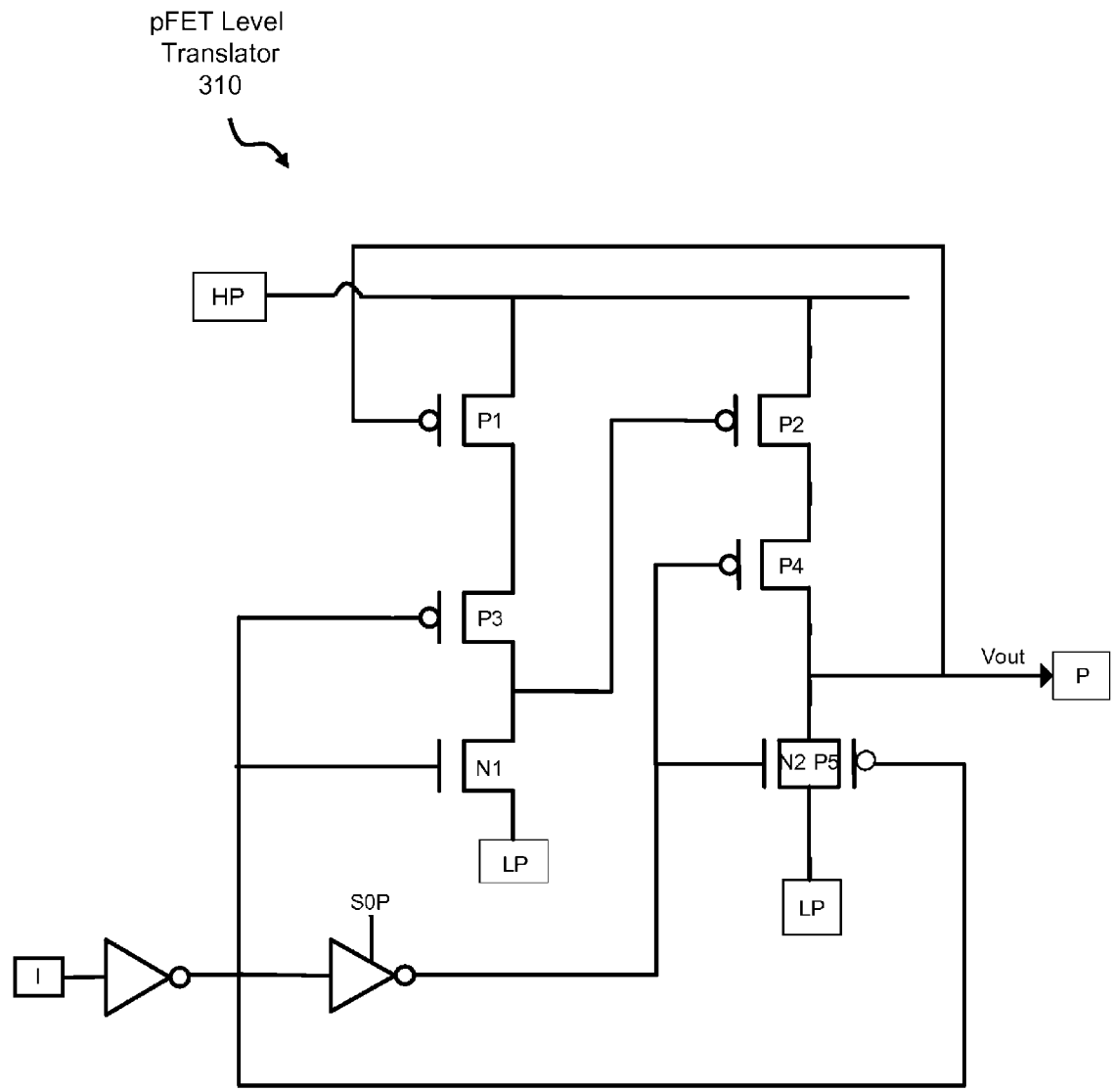
FIG. 4 is a schematic diagram of a pFET DLT (pDLT).

FIG. 4 shows a detailed schematic diagram of pFET level translator 310 which includes pFETs P1-P5, nFETs N1-N2, and a first inverter whose input is I. This inverter is serially connected to a second S0P powered inverter. HP and LP are driven according to the type of test, as shown in Table 1. The output P is sent to DUT 170.

The input to pFET level translator 310 is inverted by the first inverter to achieve an opposite output state when enabled, which is required by pFETs associated with DUT 170. In a single supply application, e.g. applying S0P to HP, the output of pFET level translator 310 has the opposite logic level with respect to the input.

In a dual supply application, S1 is applied to LP. GND is replaced by S1 to allow voltage sweeping through a pass-gate, shown in FIG. 4 as FETs N2 and P5, to DUT 170a gates.

Figure 5:
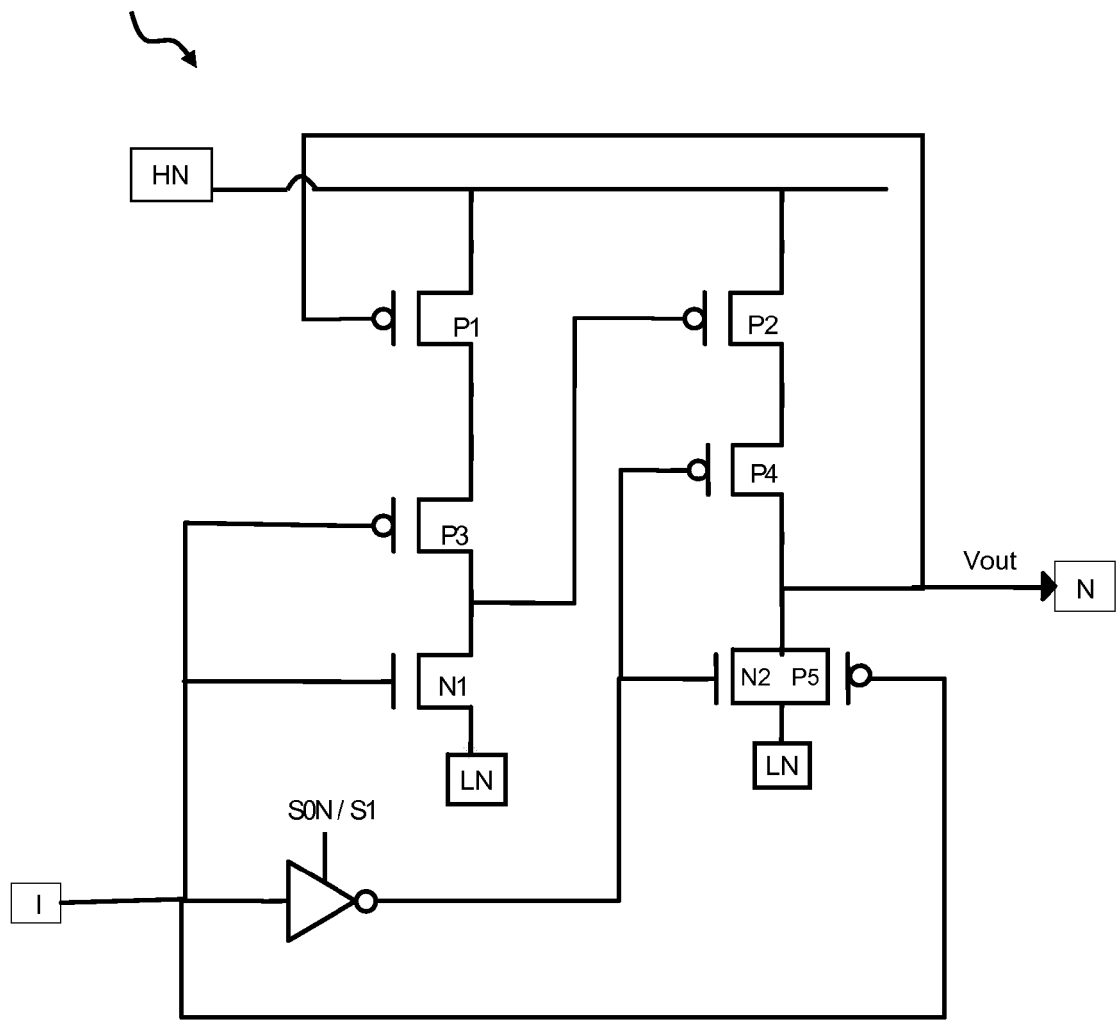
FIG. 5 is a schematic diagram of an nFET DLT (nDLT).

FIG. 5 shows a detailed schematic diagram of nFET level translator 320 which includes pFETs P1-P5, nFETs N1-N2, an inverter whose input is I, and is powered by either S0N or S1. HN and LN are driven according to the type of test, as shown in Table 1. The output N is sent to DUT 170b.

nFET level translator 320 has an input which is non-inverting. The power supply for nFET level translator 320 may originate from a derivative of the entire test structure power supply (S0N), or from a separate power supply (S1). S1 controls analog gate voltages for DUT 170b.

Figure 6:
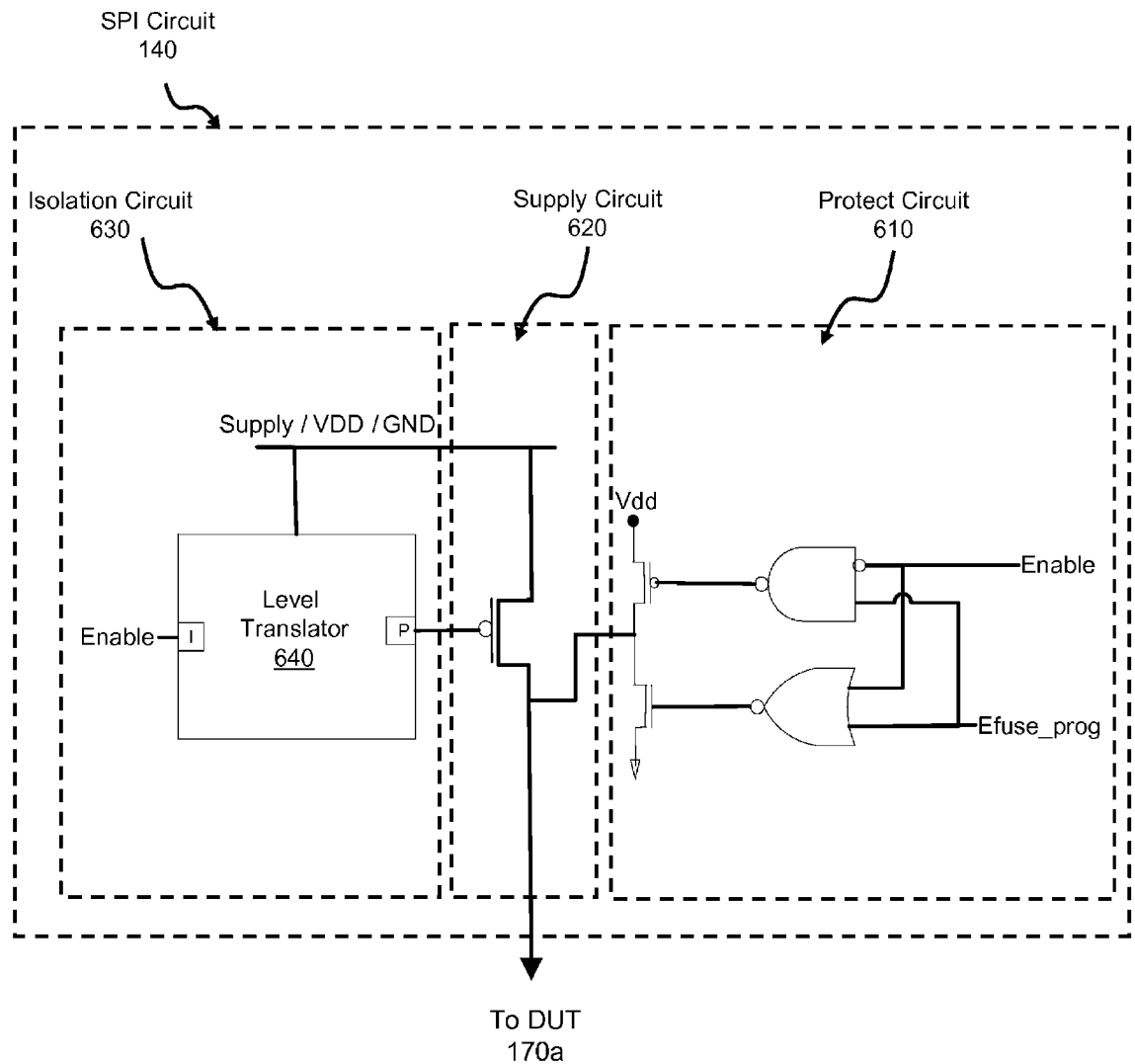
FIG. 6 is a schematic of a supply/protect/isolate (SPI) circuit.

FIG. 6 is a schematic block diagram of SPI circuit 140 which includes a protect circuit 610, a supply circuit 620, and an isolation circuit 630. Isolation circuit 630 further includes level translator 640 having a supply/VDD/GND power supply, an enable input I, and an output P, which is coupled to a pFET of supply circuit 620. A detailed schematic diagram of isolation circuit 630 is shown in FIG. 7 and described below.

Figure 7:
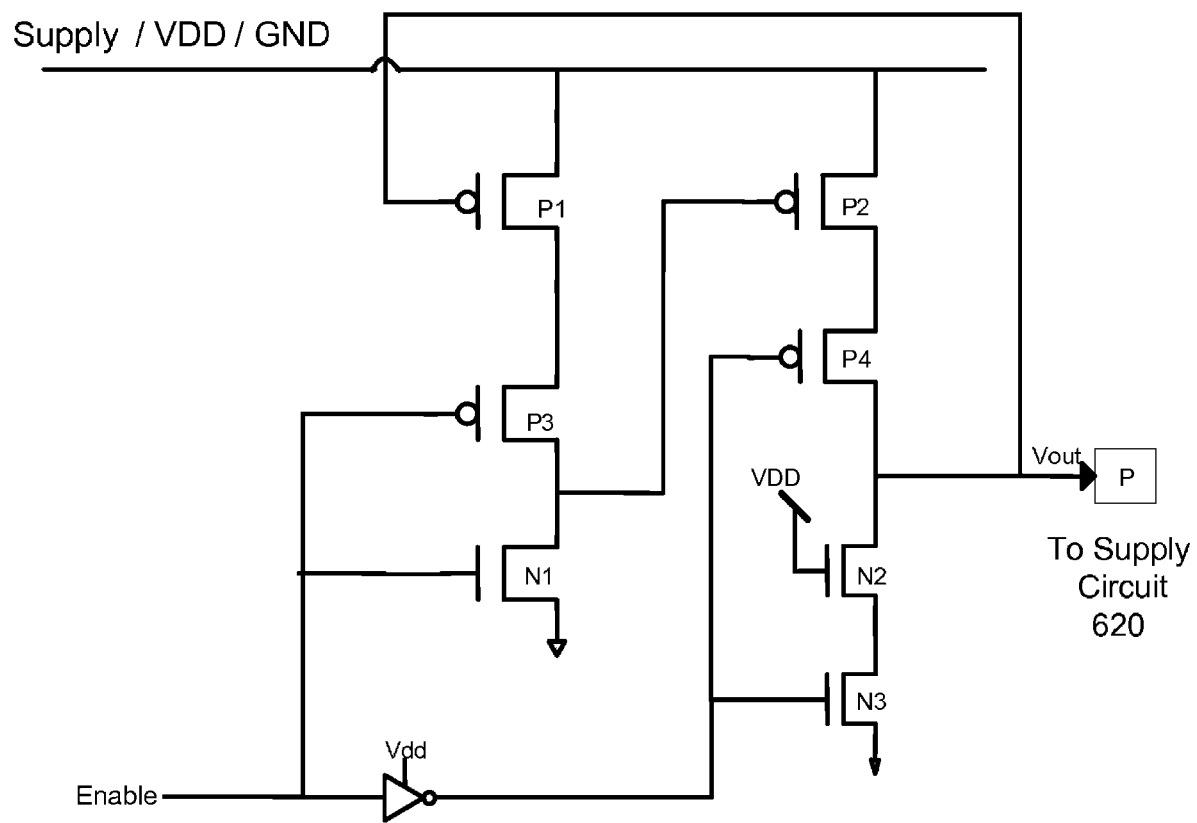
FIG. 7 is a detailed schematic diagram of the isolation circuit.

Level translator 640 of FIG. 7 includes pFETs P1-P4, nFETs N1-N3, and a Vdd powered inverter which has input I. Isolation circuit 630 electrically isolates DUT 170a so that the actual ASIC circuitry is not affected during test, nor is it affected by any leakage current from DUT 170a while the test structure is not in operation. Level translator 640 routes the supply voltage (Supply/VDD/GND) directly to the corresponding gate of the supply pFET in supply circuit 620 of FIG. 6.

Since the test structure separates nFET and pFET DUTs, it supplies each with a dedicated SPI structure. Only one of SPI circuits 140 or 150 is activated at a time. This is accomplished by selecting the appropriate SPI circuit 140 or 150 to activate using either SPI control circuit 130 or SPI control circuit 160 respectively. Although FIG. 6 shows SPI circuit 140, it is meant to be exemplary of any SPI circuit, including SPI circuit 150 and therefore SPI circuit 150 will not be discussed in further detail.

Figure 8A:
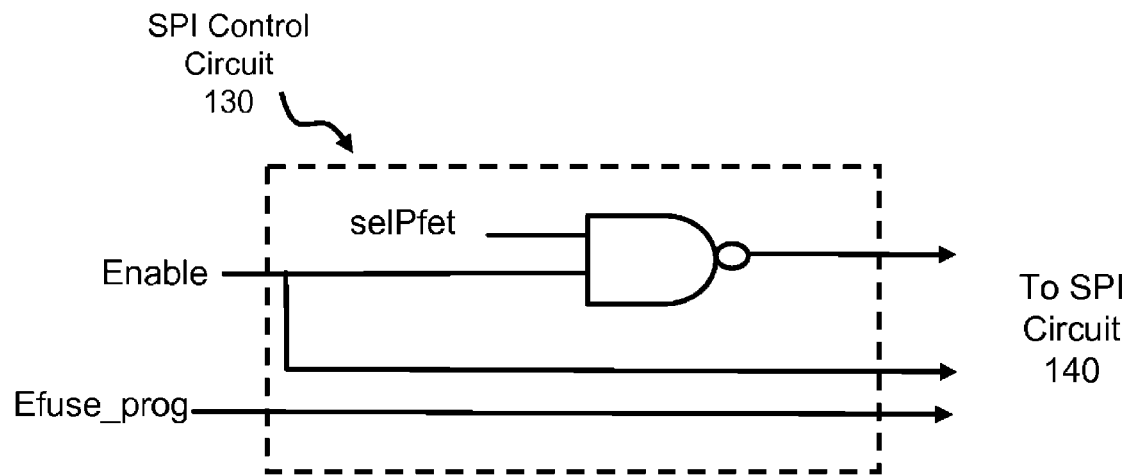
FIG. 8a is a logic diagram of an SPI control circuit for selecting pFET structures during test.
Figure 8B:
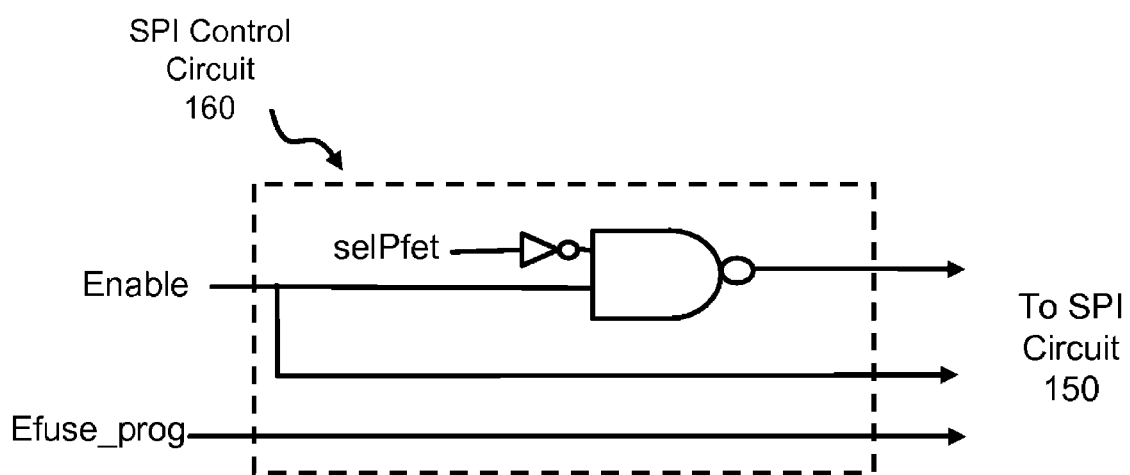
FIG. 8b is a logic diagram of an SPI control circuit for selecting nFET structures during test.

FIG. 8a shows a logic diagram of SPI control circuit 130 and FIG. 8b shows a logic diagram of SPI control circuit 160. SPI control circuit 130 further includes an Enable signal, an Efuse_prog signal, a selPfet signal, and a NAND gate having inputs from Enable and selPfet, which comes from a latch on the chip (not shown). The Enable, and Efuse_prog signal are further coupled to protect circuit 610. The NAND output directly feeds the I input of SPI circuit 140. By choosing only one SPI circuit at a time (using selPfet, and Enable), current through unused SPI circuit 150 is gated to reduce incidental leakage. Efuse_prog exists to protect non-test structure ASIC circuits (not shown). Since the test structure shares the Supply/VDD/GND pin with ASIC circuits, the existing Efuse_prog signal is used to isolate the test structure from other ASIC operations and vise versa.

The supply voltage is sourced through supply circuit 620. Supply circuit 620 includes a large supply pFET which sends an output signal to DUT 170a. The gate of the supply pFET is coupled to the output of isolation circuit 630, the source is connected to Supply/VDD/GND, and the drain is connected to the output of protect circuit 610. The supply pFET is sufficiently large to ensure it will have a minimum voltage drop during test structure measurements (<50 mV), but robust enough to handle high voltages, which may be at or above 3.0V.

SPI protect circuit 610 protects the supply pFET of supply circuit 620 from excessive source to drain, and gate to drain potential differences when high voltages are applied to Supply/VDD/GND (fatwire I/O). During high voltage applications, Supply=3.0v and the test structure is inactive (off), i.e. all DUTs 170 are turned off. When Enable=0 and Efuse_prog=1, VDD is forced through protect circuit 610 and onto the drain of the supply pFET of supply circuit 620. The largest potential difference across the supply pFET is guaranteed to never be larger than Supply minus VDD. Simulation was completed to verify this voltage level is not damaging to the supply pFET.

In the single supply mode of operation either during wafer or module final test (WFT, MFT), a tester (not shown) calculates the current by measuring the background current ($I_{BG}$) and DUT current ($I_{MEAS}$) for each of DUTs 170. $I_{ON}$ is equal to the difference between $I_{MEAS}$ and $I_{BG}$ (i.e. $I_{ON}=I_{MEAS}-I_{BG}$). The tester records the $I_{ON}$ data for DUTs 170. Table 2 shows a truth table for the Single Mode of operation used for controlling DUTs 170.

TABLE 2

Example truth table for single supply mode

| Input | | | | | Single mode | | | | | | | |
|---|---|---|---|---|---|---|---|---|---|---|---|---|
| sel-Pfet | C1 | C2 | SOP | SON | P0 | P1 | P2 | P3 | N0 | N1 | N2 | N3 |
| 0 | 0 | 0 | SOP | 0 | GND | SO | SO | SOP | SON | GND | GND | GND |
| 0 | 0 | 1 | SOP | 0 | SO | GND | SO | SOP | GND | SON | GND | GND |
| 0 | 1 | 0 | SOP | 0 | SO | SO | GND | SOP | GND | GND | SON | GND |
| 0 | 1 | 1 | SOP | 0 | SO | SO | SO | GND | GND | GND | GND | SON |
| 1 | 0 | 0 | 0 | SON | GND | SO | SO | SOP | SON | GND | GND | GND |
| 1 | 0 | 1 | 0 | SON | SO | GND | SO | SOP | GND | SON | GND | GND |
| 1 | 1 | 0 | 0 | SON | SO | SO | GND | SOP | GND | GND | SON | GND |
| 1 | 1 | 1 | 0 | SON | SO | SO | SO | GND | GND | GND | GND | SON |

Test structure 100 is also configurable to separately control DUT 170 gate voltages. Dual supply mode testing enables threshold voltage, $V_t$, measurement capability, in addition to $I_{ON}$ measurement capability. In dual supply mode, effective current ($I_{eff}$) can be calculated. $I_{eff}$ is a better indicator of device performance than $I_{ON}$ alone. To implement dual supply mode a dedicated pad, S1, must be wired out. S1 is shown in FIG. 3 as LN and HP respectively.

Table 3 shows an example truth table for dual supply mode.

TABLE 3

Example truth table for dual supply mode

| Input | | | | | Dual mode | | | | | | | |
|---|---|---|---|---|---|---|---|---|---|---|---|---|
| sel-Pfet | C1 | C2 | SOP | SON | P0 | P1 | P2 | P3 | N0 | N1 | N2 | N3 |
| 0 | 0 | 0 | SOP | 0 | S1 | SOP | SOP | SOP | S1 | GND | GND | GND |
| 0 | 0 | 1 | SOP | 0 | SOP | S1 | SOP | SOP | GND | S1 | GND | GND |
| 0 | 1 | 0 | SOP | 0 | SOP | SOP | S1 | SOP | GND | GND | S1 | GND |
| 0 | 1 | 1 | SOP | 0 | SOP | SOP | SOP | S1 | GND | GND | GND | S1 |
| 1 | 0 | 0 | 0 | SON | S1 | SOP | SOP | SOP | S1 | GND | GND | GND |
| 1 | 0 | 1 | 0 | SON | SOP | S1 | SOP | SOP | GND | S1 | GND | GND |
| 1 | 1 | 0 | 0 | SON | SOP | SOP | S1 | SOP | GND | GND | S1 | GND |
| 1 | 1 | 1 | 0 | SON | SOP | SOP | SOP | S1 | GND | GND | GND | S1 |

Test structure 100 may be placed in various locations within an ASIC design to test different areas of the same chip. Alternative DUT 170 structures may also be incorporated into the design such that each test structure is able to test a particular DUT structure in proximity to it. A single test structure 100 may also be designed to test multiple varieties of DUTs 170, such as wires, resistors, capacitors, inductors, etc., within a specific chip location. The following figures provide examples of integrating test structure 100 into a circuit design. The following example embodiments are shown for illustrative purposes and are not intended to limit the invention to only those configurations illustrated. One of ordinary skill in the art will appreciate other configurations within the scope and spirit of the present invention.

Figure 9:
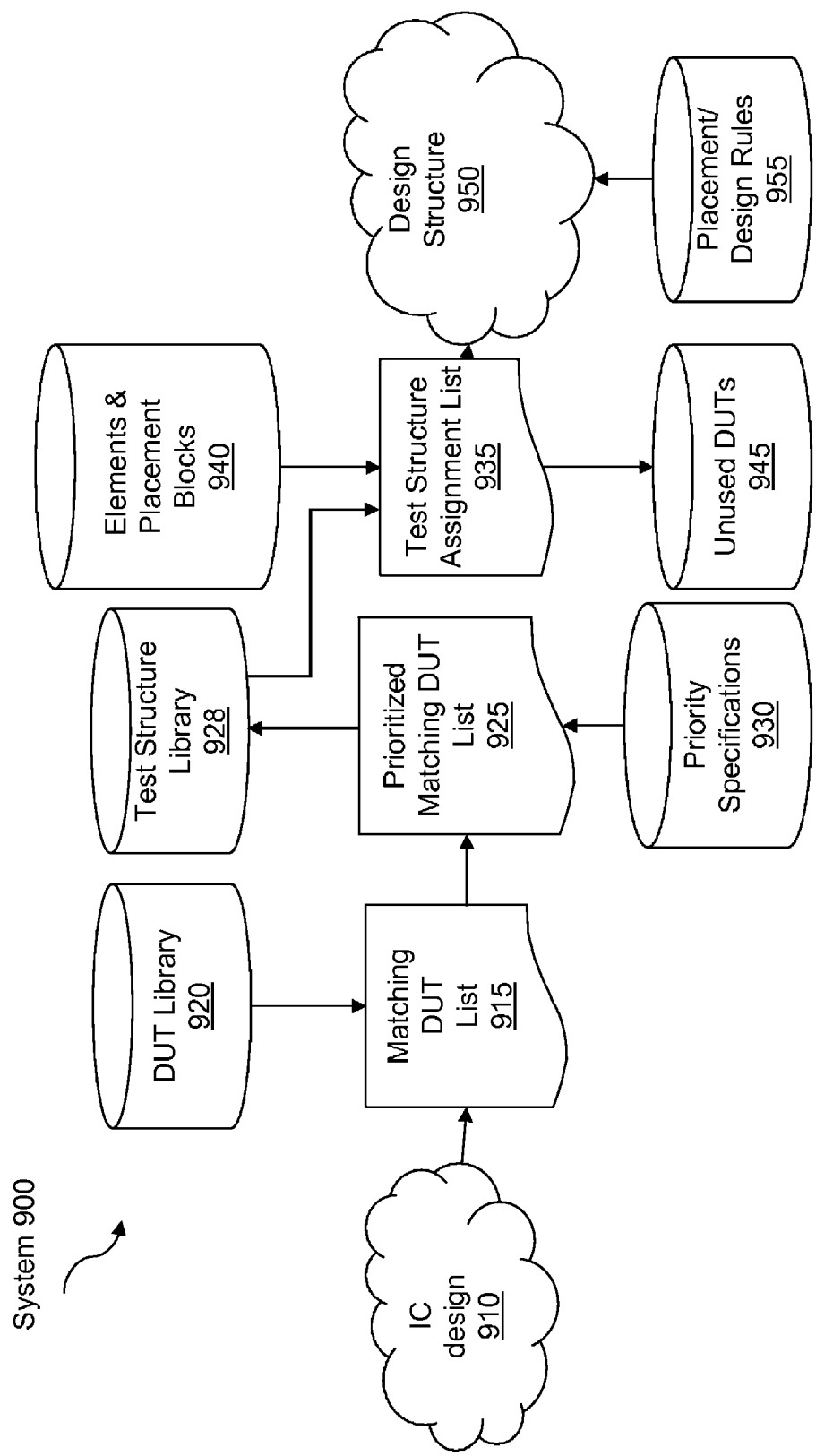
FIG. 9 shows a system block diagram of the test structure integration system of an embodiment.

FIG. 9 shows a system 900 for integrating test structure 100 into an IC design 910. System 900 includes a DUT library 920, which generates a matching DUT list 915 according to IC design 910. A priority specifications 930 database provides prioritization information for generating a prioritized matching DUT list 925 from matching DUT list 915. A test structure library 928 comprises stored test structures 100 which are created by combining control structures 190 with DUTs 170. Test structures 100 are generated according to prioritized matching DUT list 925 and other design parameters. For example, the top 8 highest priority DUTs 170 may be combined with control structure 190 to create a first test structure 100a, the next 8 may be combined to generate test structure 100b and so on. An elements and placement blocks 940 database provides information to generate a test structure assignment list 935 from prioritized test structure library 928. An unused DUTs 945 database receives a list all DUTs 170 that were listed in prioritized matching DUT list 925 but not used in final test structure assignment list 935. System 900 further includes a placement/design rules 955 database to finalize placement and integration of test structures 100 resulting in a design structure 950 used for manufacturing the IC. Data structure 950 may be a GDSII file, for example. Data structure 950 comprises, for illustrative purposes, at least one test structure 100 having a DUT 170 from prioritized matching DUT list 925 and coupled to at least one element of IC design 910.

Figure 10:
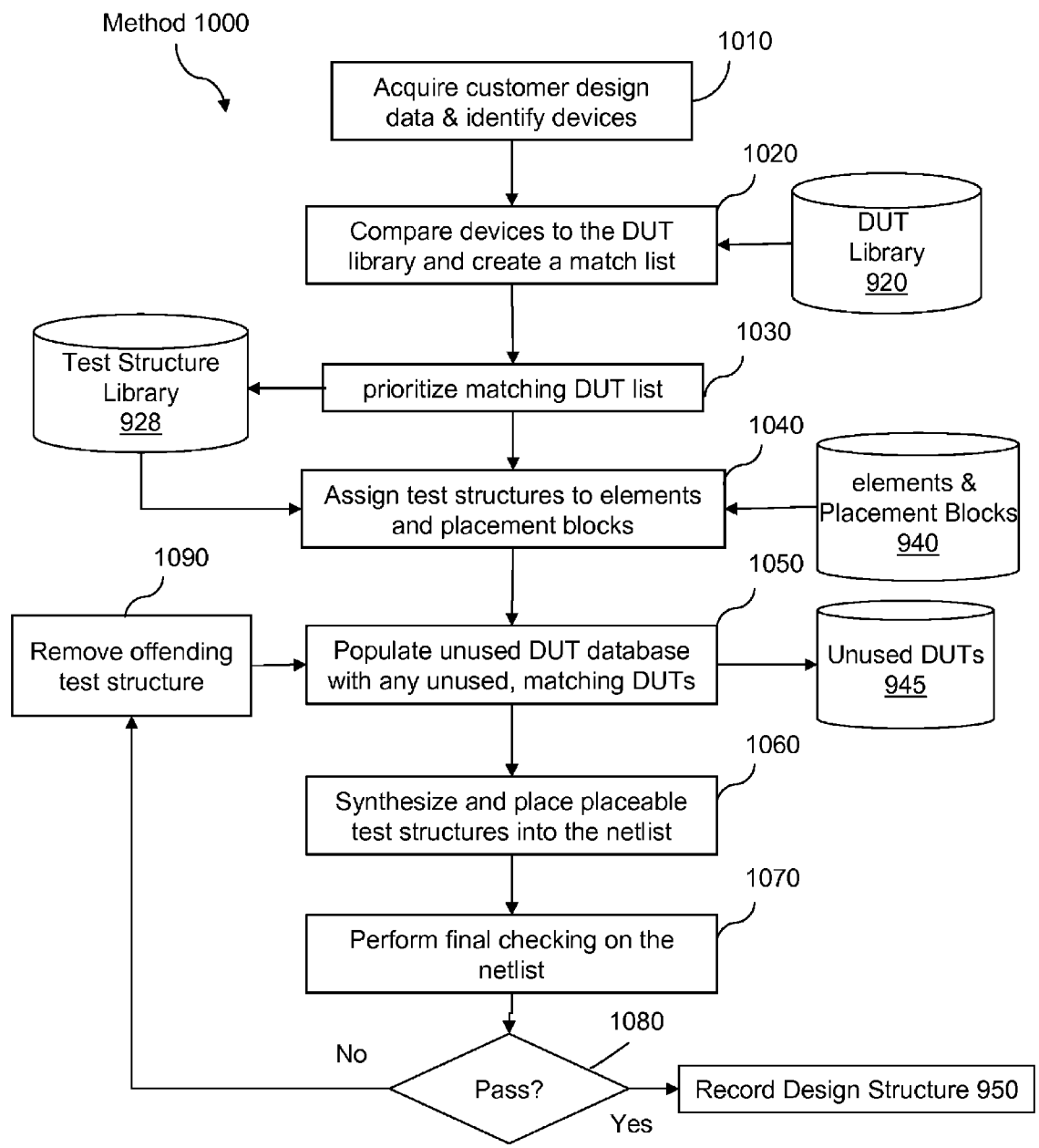
FIG. 10 is a flow diagram of one method of integrating the test structure of an embodiment into a netlist.

FIG. 10 shows a method 1000 of operating system 900 to integrate test structures 100 into IC design 910. In step 1010, method 1000 identifies discrete elements or devices in IC design 910 which may be potential candidates for testing.

In step 1020, method 1000 compares devices identified in step 1010 with DUTs 170 comprised in DUT library 920 and creates matching DUT list 915, which comprises a list of matching DUTs.

In step 1030, method 1000 creates prioritized matching DUT list 925 by prioritizing matching DUT list 915. Method 1000 uses prioritization algorithms and prioritization data stored in priority specifications 930 database (see FIG. 11 for details) to prioritize DUTs 170 located in matching DUT list 915 and generates prioritized matching DUT list 925. From prioritized matching DUT list 925, method 1000 generates test structures 100 by combining DUTs 170 with control structures 190. Test structures 100 are stored in test structure library 928. The corresponding test structures 100 are prioritized based on the priority of DUTs 170 in prioritized matching DUT list 925. Accordingly, the highest priority discrete devices, elements, cores, IP, macros, etc. in design 910 will be the first to have an assigned test structure 100.

In step 1040, method 1000 assigns test structures 100 from test structure library 928 (beginning with the highest priority test structures 100) to elements (e.g. fat wires, I/O, etc.) of design 910 as provided by elements and placement blocks 940 database. Step 1040 continues until either 1. there are no more elements of design 910 capable of being assigned a test structure 100, 2. there are no more test structures 100 to assign, or 3. there is no physical space available (e.g. placement block) to insert another test structure 100 into design 910. Other issues may factor into terminating step 1040 and those listed above are only examples. Step 1040 is described in detail in FIGS. 19-22.

In step 1050, method 1000 populates unused DUTs 945 database with DUTs 170 which were listed in prioritized matching DUT list 925, but which were not assigned to an element in step 1040.

In step 1060, method 1000 integrates selected test structures 100 into design 910 using placement/design rules 955 and synthesis tools to generate design structure 950. Several examples of test structure 100 placement into IC design 910 are shown in FIGS. 12-18.

In step 1070, method 1000 performs final checking algorithms on data structure 950 to ensure design for manufacturability requirements are met (e.g. release process rules, DRC, LVS, wire load checking, etc.). If any design checking rules fail, method 1000 makes the necessary placement and routing changes to ensure compliance with specifications such as, DFM rules, product specifications, functional design requirements. If no solution is found for a particular test structure 100, store DUTs 170 from non-placeable test structures 100 in unused DUTs 945 database.

In step 1080, method 1000 determines whether design structure 950 passes all tests. If yes, method 1000 records final design structure 950 and exits. If no, method 1000 proceeds to step 1090.

In step 1090, method 1000 removes test structure 100 which is causing failure(s) and proceeds to step 1050. Method 1000 iterates until all checking algorithms pass.

Figure 11:
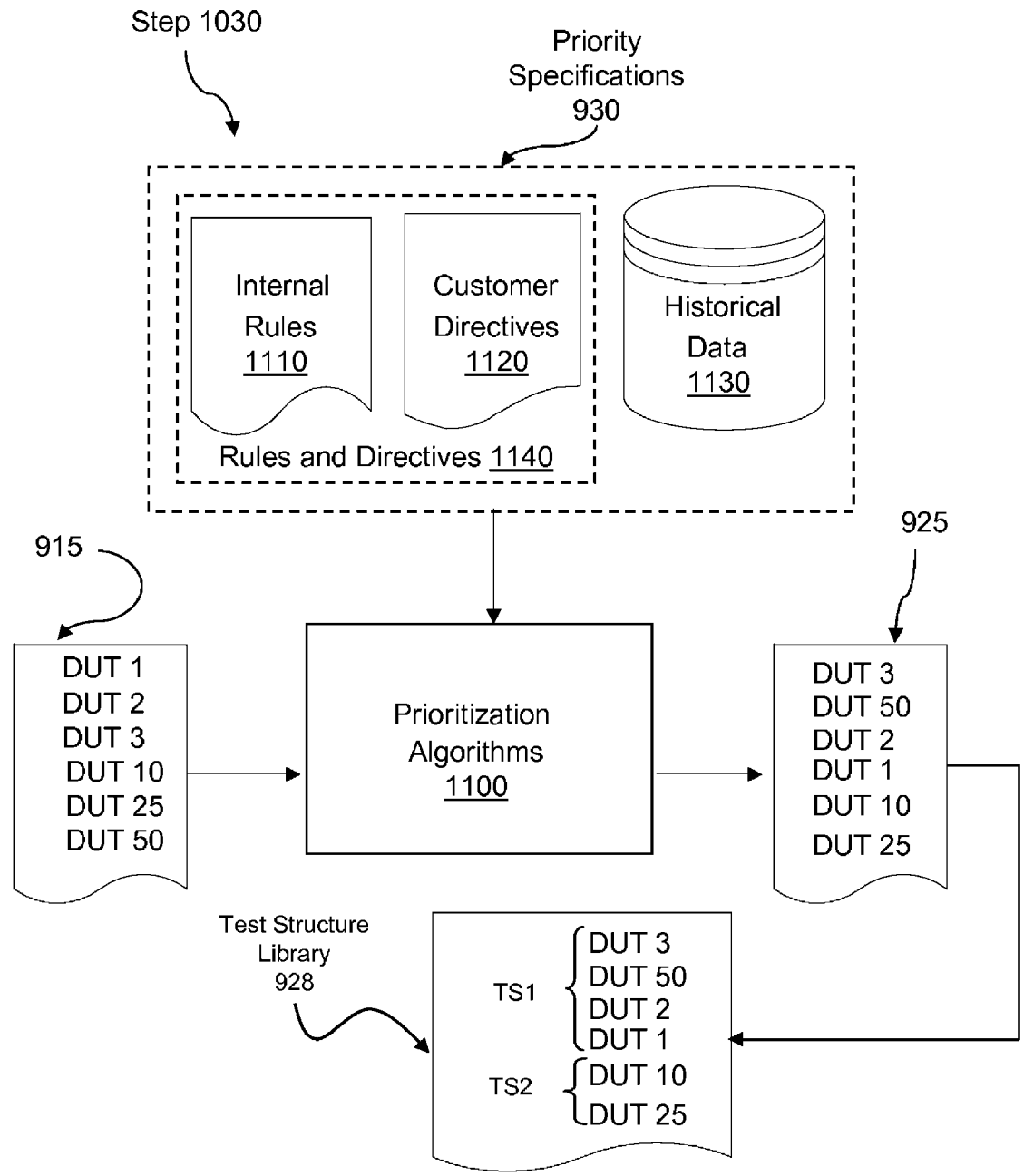
FIG. 11 is a detailed example of the step of prioritizing a match list of devices under test (DUTs).

FIG. 11 shows a detailed example diagram of prioritization step 1030 of method 1000. Matching DUT list 915 shows a list of matching DUTs 170: DUT 1, DUT 2, DUT 3, DUT 10, DUT 25, and DUT 50 which match devices and/or elements in IC design 910. A plurality of prioritization algorithms 1100, prioritize list 915 to generate prioritized matching DUT list 925. Prioritization algorithms 1100 use data input from priority specifications 930. Priority specifications 930 includes rules and directives 1140, which further includes, for example, internal rules 1110 and customer directives 1120. Priority specifications 930 further includes historical data 1130. One of skill in the art would appreciate that there are many other data points which could be used to prioritize list 915. In this example, prioritized matching DUT list 925 shows DUTs 170 prioritized in the following order: DUT3, DUT50, DUT2, DUT1, DUT10, and DUT25. Therefore, DUT3 is the highest priority test structure 100 in this example and will be the first to be placed into IC design 910 in step 1040 by method 1000. Following the placement of DUT3 is DUT50, and so on.

An example data set of test structure library 928 is also shown in FIG. 11. Derived from list 925, method 1000 generates test structures 100 from the prioritized DUTs 170. In the illustrated example, method 1000 creates TS1 by combining a control structure 190 (not shown) with DUT3, DUT50, DUT2, and DUT1. Similarly, method 1000 generates TS2 using DUT10 and DUT 25.

FIGS. 12-17 show examples of test structure 100 placements within design 950. FIGS. 12-17 are only a few examples of placement configurations and should not be construed as limitations. As can be appreciated by one of ordinary skill in the art, test structures 100 may be placed anywhere in an integrated circuit design such that all design rules are satisfied and the purpose of test structure 100 is fulfilled. Additionally, the types of measurements desired will dictate the optimum placement or placements within an integrated circuit design.

Figure 12:
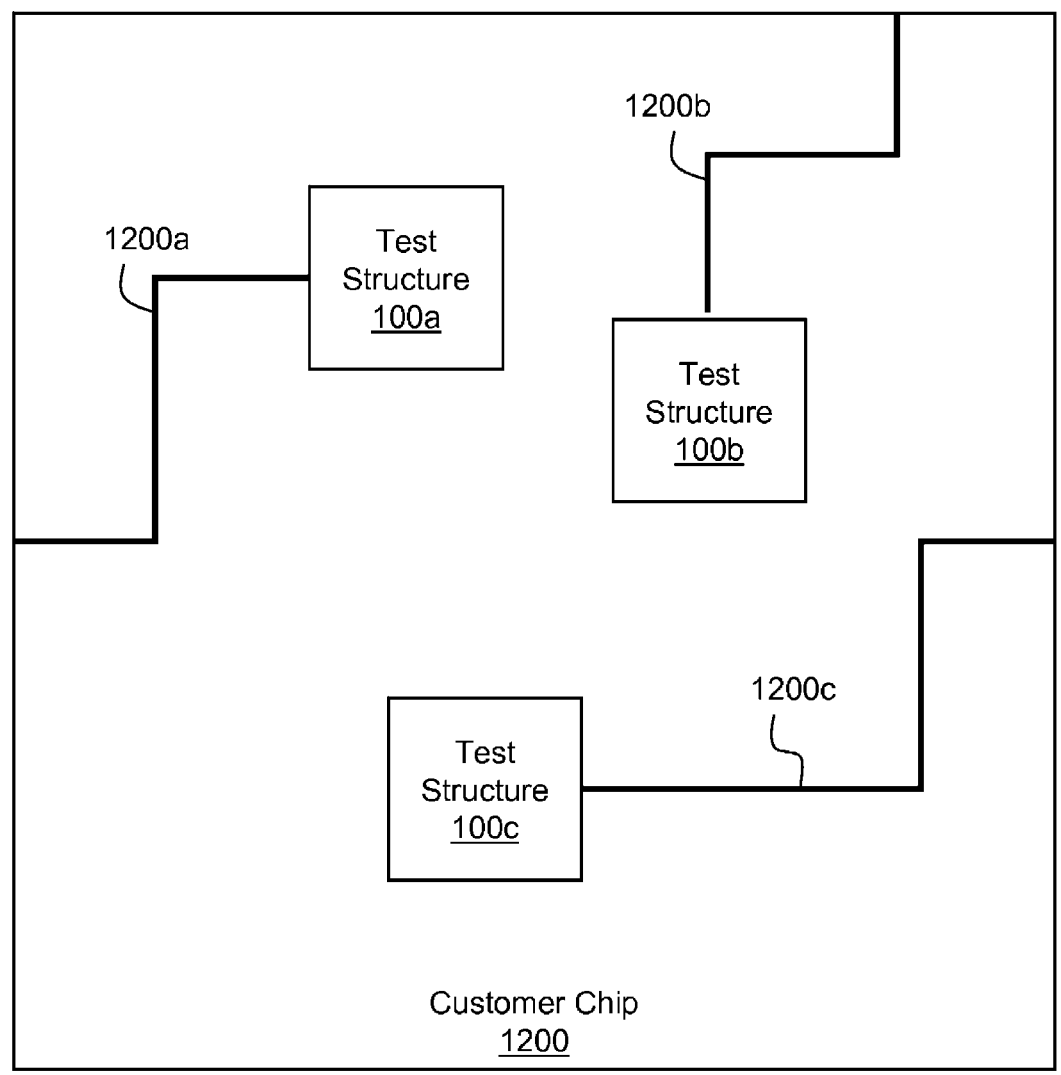
FIGS. 12-17 show examples of possible internal rules or customer directives used for prioritizing and assigning the test structures within an integrated circuit design according to an embodiment.

FIG. 12 shows an example placement configuration that provides routing optimization by remaining within wiring limitations of a power supply, effectively minimizing IR drop through constraining metal routing distances. This is an example placement configuration in which internal rules and directives 1140 dictates that test structures 100*a, b*, and *c* need to be coupled to elements 1200*a*, 1200*b*, and 1200*c* respectively such that metal routing distances are minimized, thus minimizing IR drop. Test structures 100 are coupled to elements 1200 at the supply/Vdd/GND rail, as shown in FIG. 1.

Figure 13:
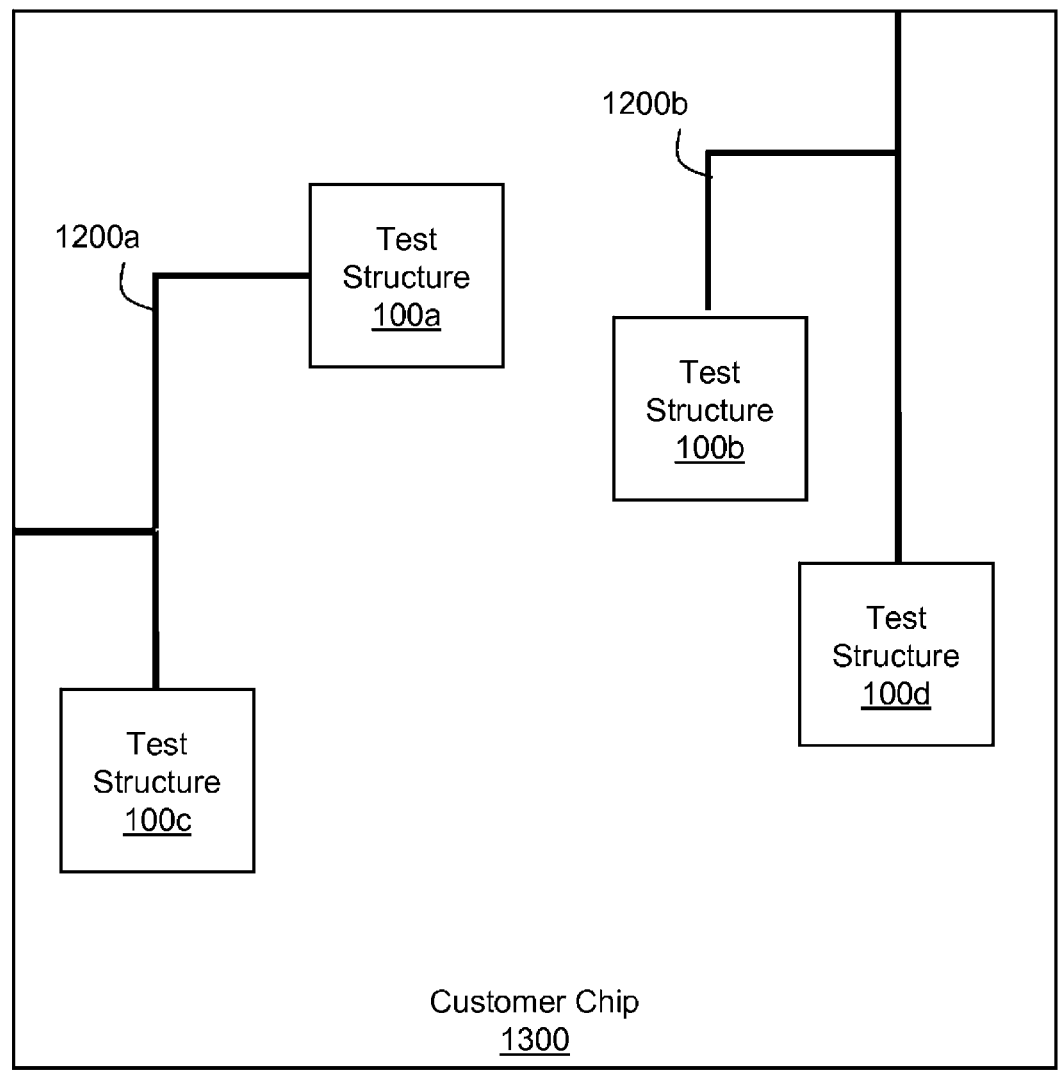

FIG. 13 shows a placement example where internal rules and directives 1140 dictates a fanout configuration for placement such that test structures 100*a* and 100*c* must be coupled to element 1200*a* and test structures 100*b* and 100*d* must be coupled to element 1200*b*. In this example, the fanout optimization maintains leakage limits, capacitive loading and balance loading for customer chip 1300.

Figure 14:
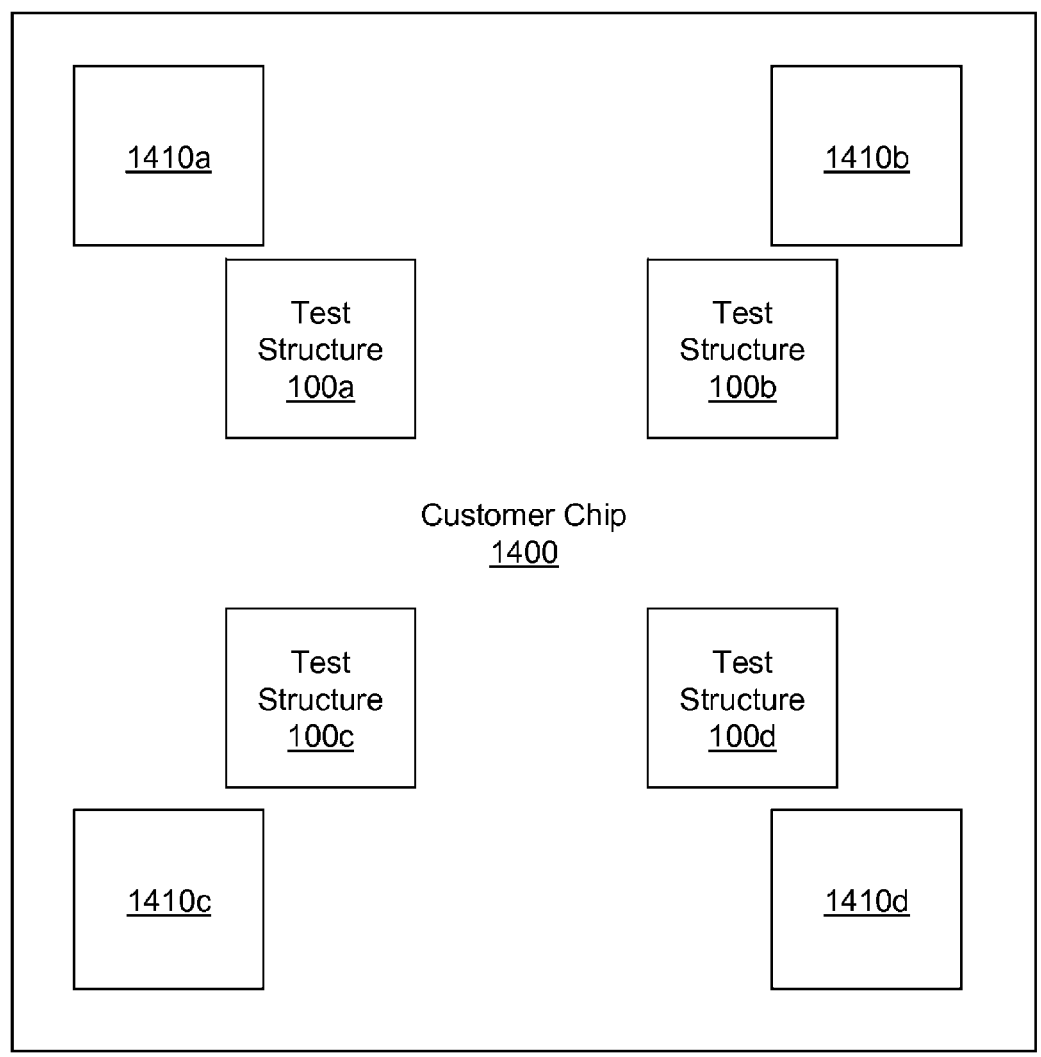

FIG. 14 shows a placement configuration example where internal rules and directives 1140 dictates a proximity requirement for a plurality of macros 1410*a-d* such that each of test structures 100*a-d* is located near to its respective macro 1410. For example, macro 1410 may be a PSRO. This configuration is used to validate, for example, screening methodology and AC to DC correlation.

Figure 15:
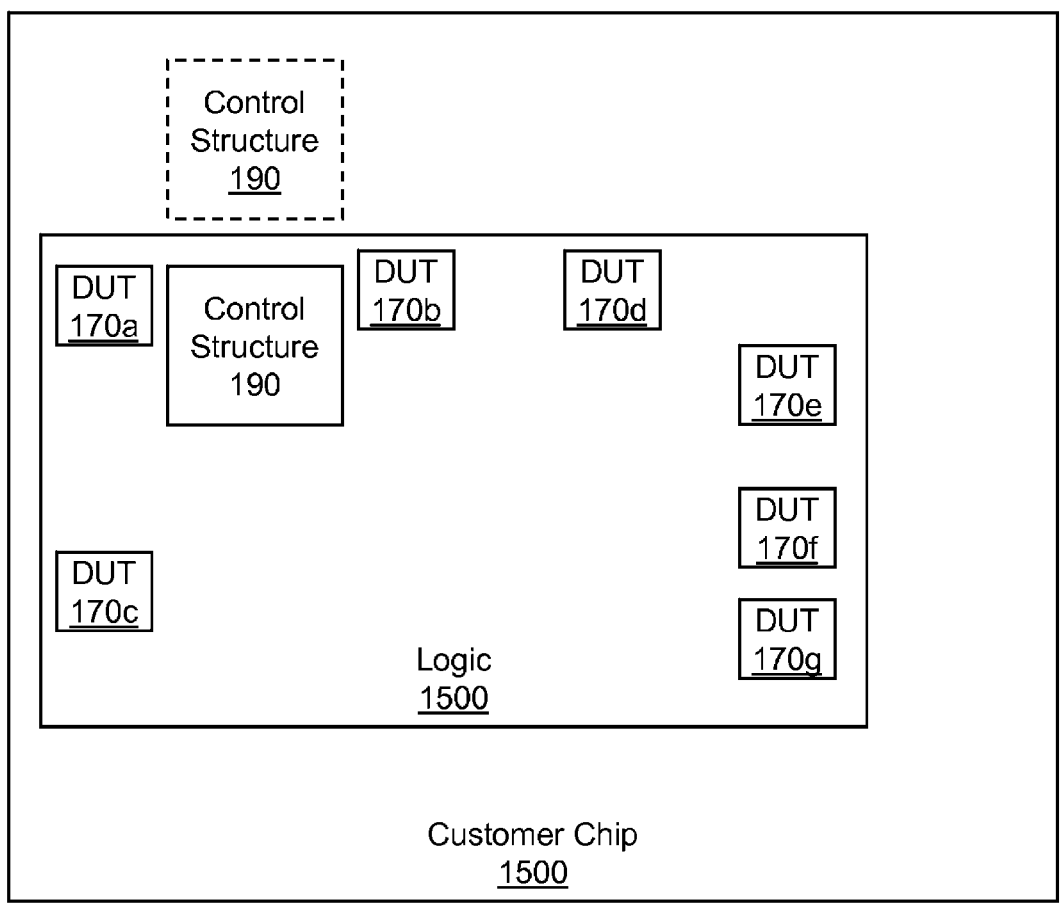

FIG. 15 shows a placement configuration example where internal rules and directives 1140 dictates a logic 1500 must comprise DUTs 170*a-g* and further that control structure 190 may be placed either within logic 1500 or outside of logic 1500. FIG. 15 is further an example of a non-contiguous test structure 100.

Figure 16:
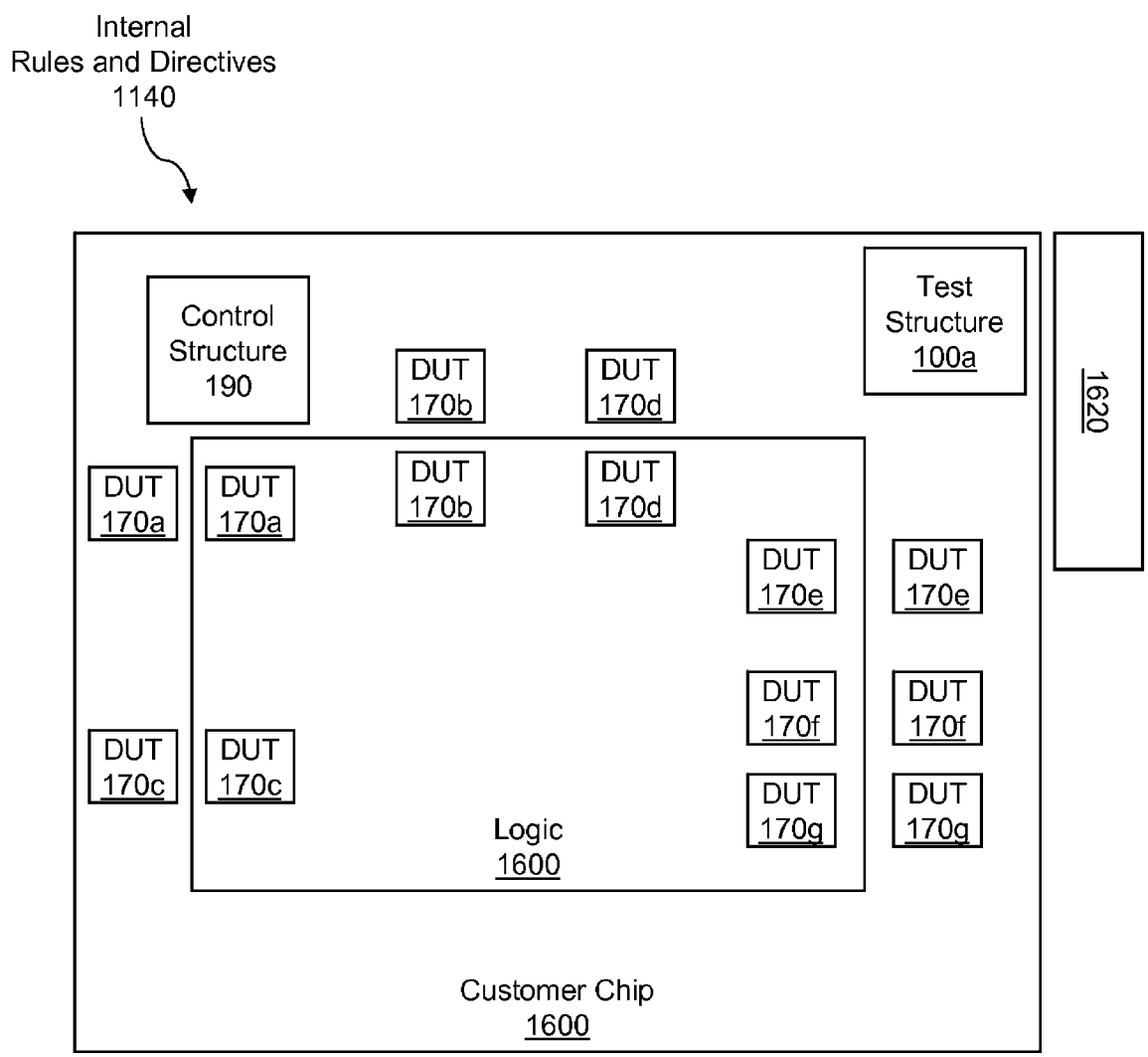

FIG. 16 is a configuration example of a placement for both a contiguous and non-contiguous test structure 100, where DUTs 170*a-g* may be placed both within and/or without a logic 1600 and control structure 190 must be placed in proximity to logic 1600 for controlling DUTs 170*g*. Test structure 100*a* is a contiguous test structure which must be placed in proximity to element 1620. Element 1620 may be a kerf, for example.

Figure 17:
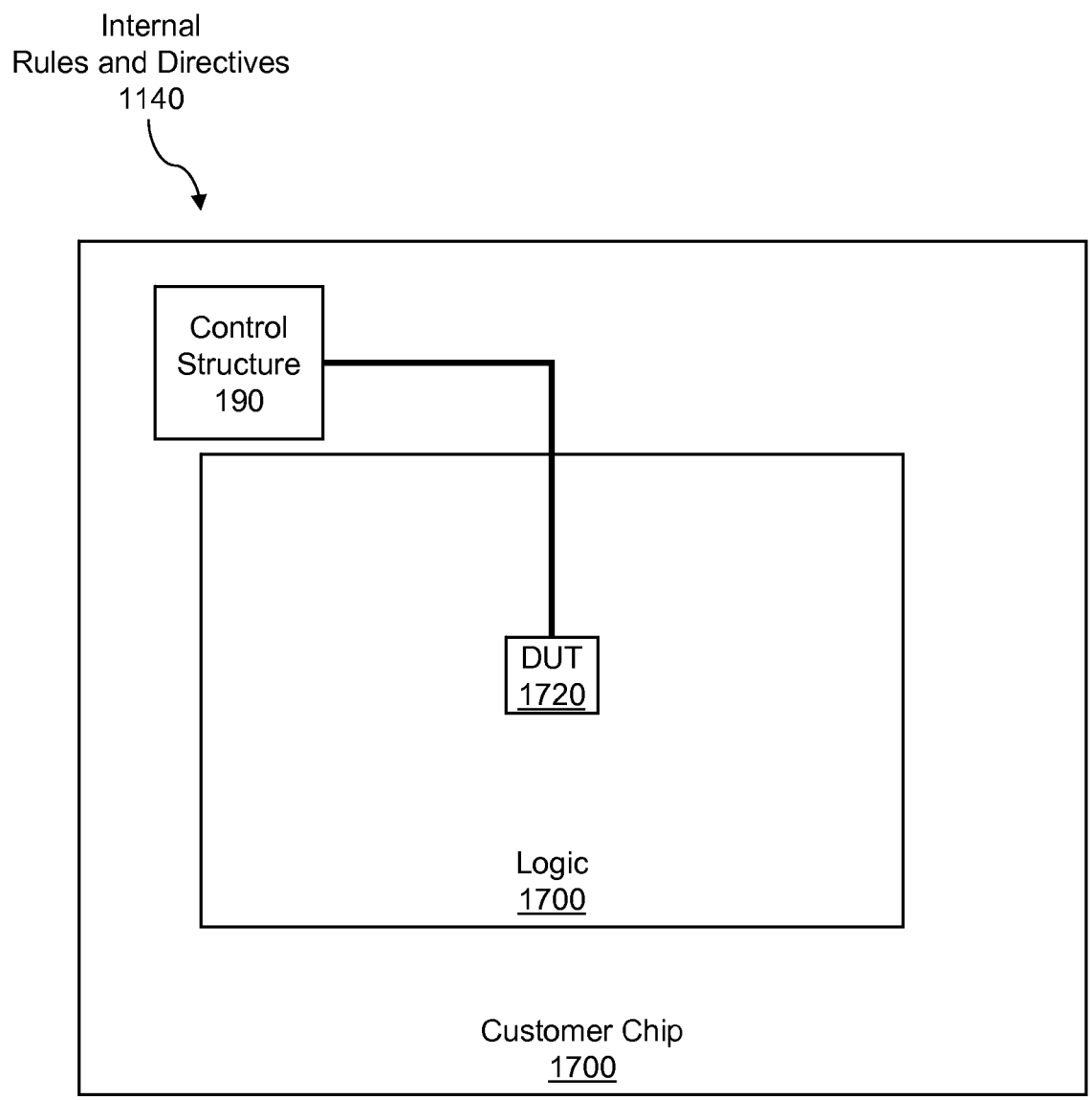

FIG. 17 shows a placement configuration example where internal rules and directives 1140 dictates a particular DUT 170 must be placed within a logic block 1700. Control structure 190 has a proximity requirement in order to control DUT 170.

Figure 18:
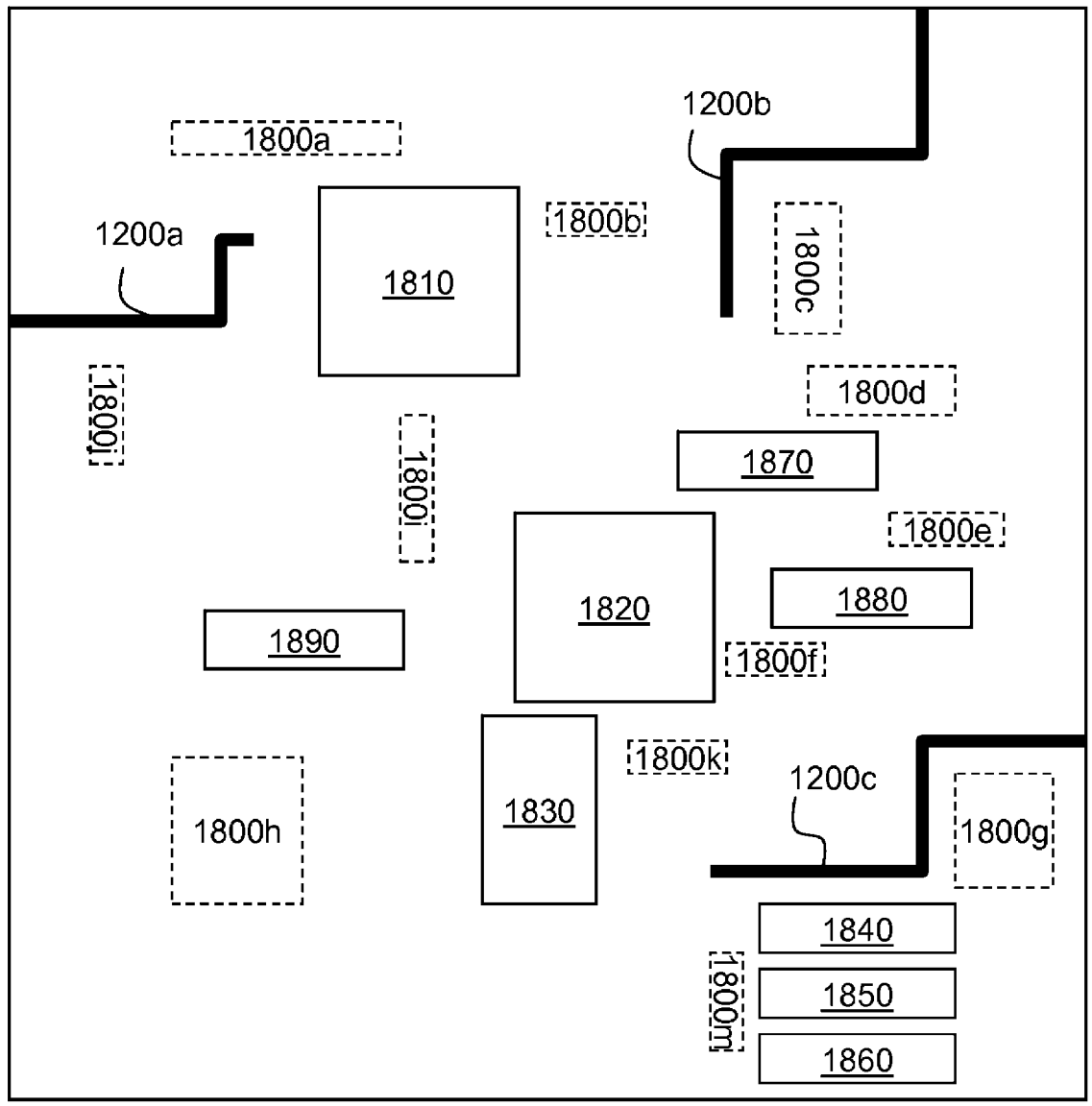
FIG. 18 is an example layout of a netlist including logic, elements for coupling test structures, and available chip area for placing test structures according to an embodiment.
Figure 23:
FIG. 23 is a table illustrating possible placement assignment locations for each of the test structures.

FIG. 18 shows an example of an IC design 910 layout in combination with elements and placement blocks 940. Design 910 layout includes elements 1200*a*, 1200*b*, and 1200*c*, a plurality of placement blocks 1800, and a plurality of logic macros 1810-1890. Placement blocks 1800 are areas of available silicon that are large enough to hold contiguous and/or non-contiguous test structures 100. Test structures 100 from prioritized matching test structures list 925 are assigned to one or more of placement blocks 1800 in step 1040 of method 1000. A resulting placement options table 2300 is shown in FIG. 23.

Other example configurations, which are not shown include: placing enough test structures 100 in a customer chip such that the special placement of the test structures 100 provides systematic cross chip variations measurements. Placing a test structure 100 near a macro having critical timing requirements allows verification of ASST testing results and verification of AC testing results. Placing DUTs 170 within a macro's boundaries on a customer chip provides a controlled physical environment including similar backfill and is consistent with wiring density and device geometries. Yet another placement example includes placing a test structure 100 near a kerf and another test structure 100 near a macro to quantify DC offset from: chip to kerf, kerf to macro, and chip to macro.

An important process improvement provided by the present invention is that the parametric data collected from the test structures during test is fed back into the manufacturing line to adjust the responsible process steps necessary to bring the chip parameters into compliance with specifications. For example, a key process parameter that has heretofore gone unmonitored is N to P skew, which is a measurement of Nfet to Pfet of a deviation from their nominal threshold voltages. By using this invention the Nfet and Pfet skew can be adjusted to the correct the skew variation between the devices by changing one of the processes, such as the implant process, in the line to correct the skew.

Figure 19:
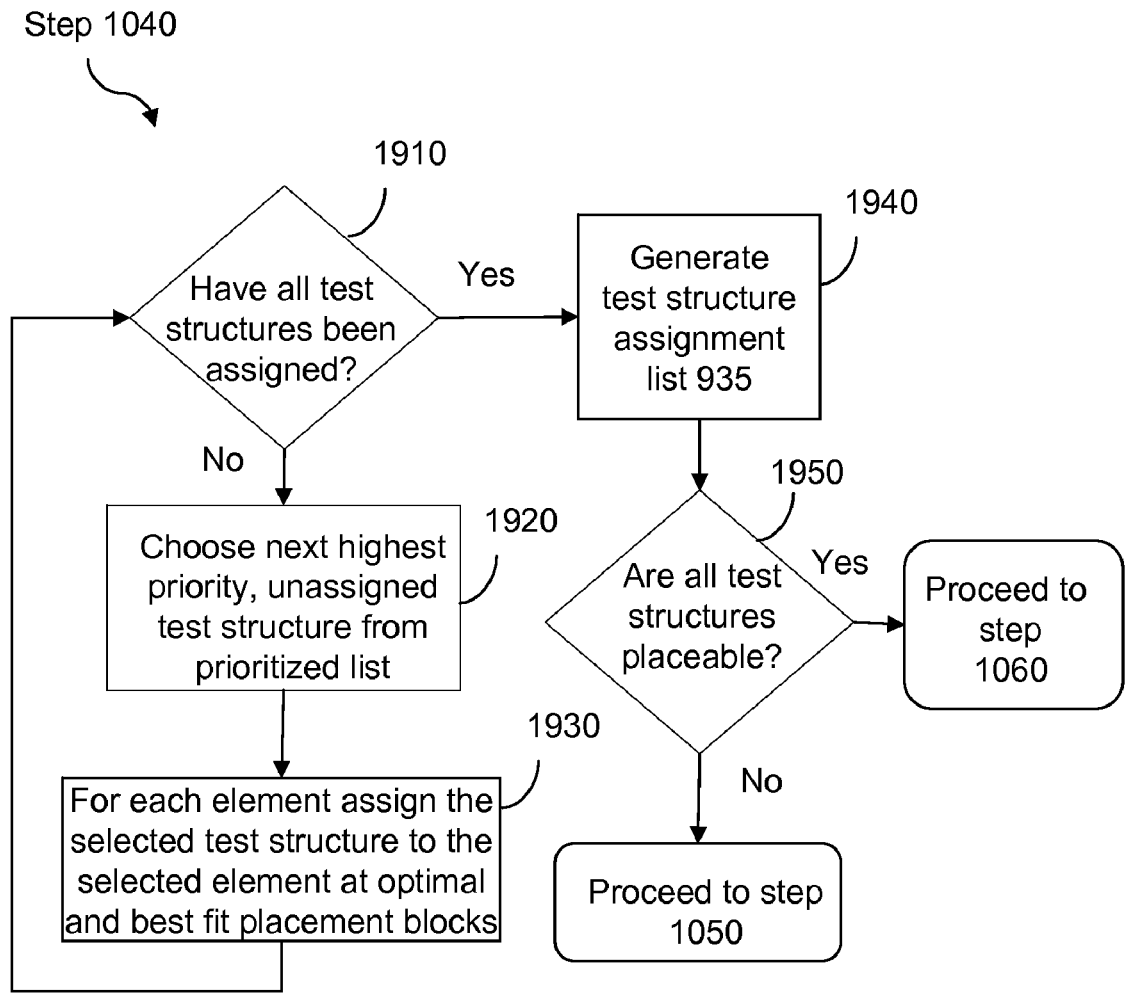
FIG. 19 is a flow diagram of an example method of assigning test structures to placeable areas (e.g. placement blocks) on a chip.

FIG. 19 is a detailed description of step 1040 of method 1000. In step 1910, method 1000 determines whether all test structures 100 in prioritized test structures list 925 have been assigned a placement block 1800. If yes method 1000 proceeds to step 1940, if no, method 1000 proceeds to step 1920.

In step 1920 method 1000 chooses the highest priority, unassigned test structure 100 from test structure library 928 and proceeds to step 1930. For example, method 1000 chooses a test structure 100 TS3.

In step 1930 method 1000 analyzes each element 1200 and assigns selected test structure 100 to appropriate placement blocks 1800 for each element 1200. For example, method 1000 analyzes element 1200a and assigns placement blocks 1800a, 1800b, and 1800i as optimal placement areas for TS3 and records the data in placement options table 2300 (see FIG. 23). Method 1000 continues to element 1200b and assigns placement blocks 1800b, 1800c', and 1800d' to TS3 in placement options table 2300. Whereby 1800b is an optimal placement block and 1800c' and 1800d' are best-fit placement blocks. Method 1000 proceeds to analyzing element 1200c. It assigns placement blocks 1800k, 1800f, 1800g' to TS3 in placement options table 2300, whereby 1800k and 1800f are optimal placement blocks and 1800g' is a best-fit placement block. Since there are no more elements 1200, method 1000 returns to step 1910.

In step 1940, method 1000 generates a test structure assignment list 935 and proceeds to step 1950. Step 1940 is explained in further detail in FIG. 24.

In step 1950, method 1000 determines whether all test structures 100 are placeable. If yes, method 1000 proceeds to step 1060 for synthesis. If no, method 1000 proceeds to step 1050 to store DUTs 170 from non-placeable test structures 100 in unused DUTs 945 database.

Figure 20:
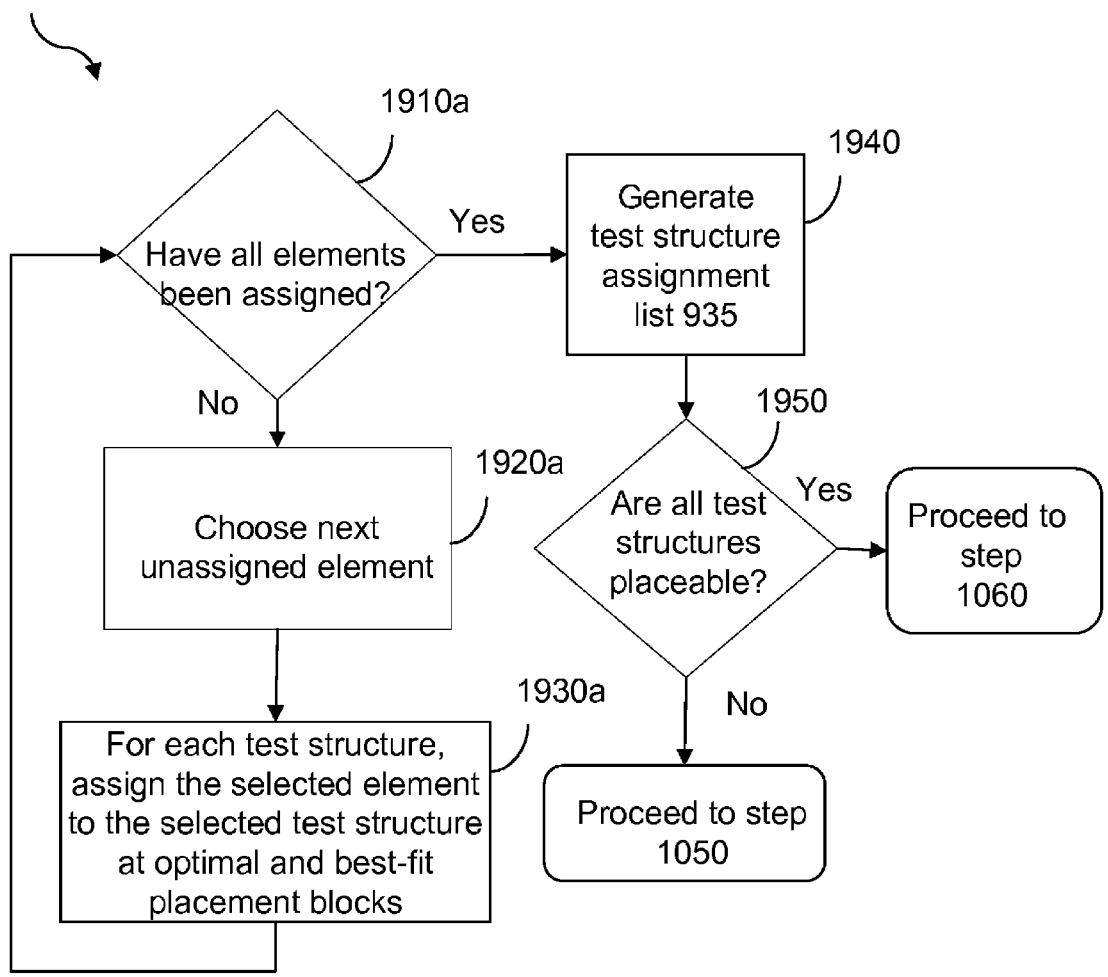
FIG. 20 illustrates a flow diagram of an example of an alternate method of assigning test structures to placement blocks on a chip.

FIG. 20 is an alternate step 1040. In step 1910a method 1000 determines whether all elements 1200 have been assigned. If yes method 1000 proceeds to step 1940, if no, method 1000 proceeds to step 1920a.

In step 1920a method 1000 chooses the next unassigned element 1200 and proceeds to step 1930a.

In step 1930a method 1000 assigns appropriate placement blocks 1800 to the selected element 1200 for each test structure 100. For example, method 1000 selects element 1200a and TS3. Method 1000 then assigns placement blocks 1800a, 1800b, and 1800i for TS3 and element 1200a in placement options table 2300. Next, method 1000 selects TS1 and assigns 1800a', 1800j' as best-fit placement blocks 1800 in placement options table 2300. Method 1000 then selects TS2 and assigns best fit placement blocks 1800a', 1800j', 1800i' in placement options table 2300. Finally, method 1000 selects TS4 but no placement blocks 1800 are available for assignment at element 1200a which meet requirements for TS4 so no placement blocks 1800 are entered into placement options table 2300. Method 1000 returns to step 1910.

Figure 21:
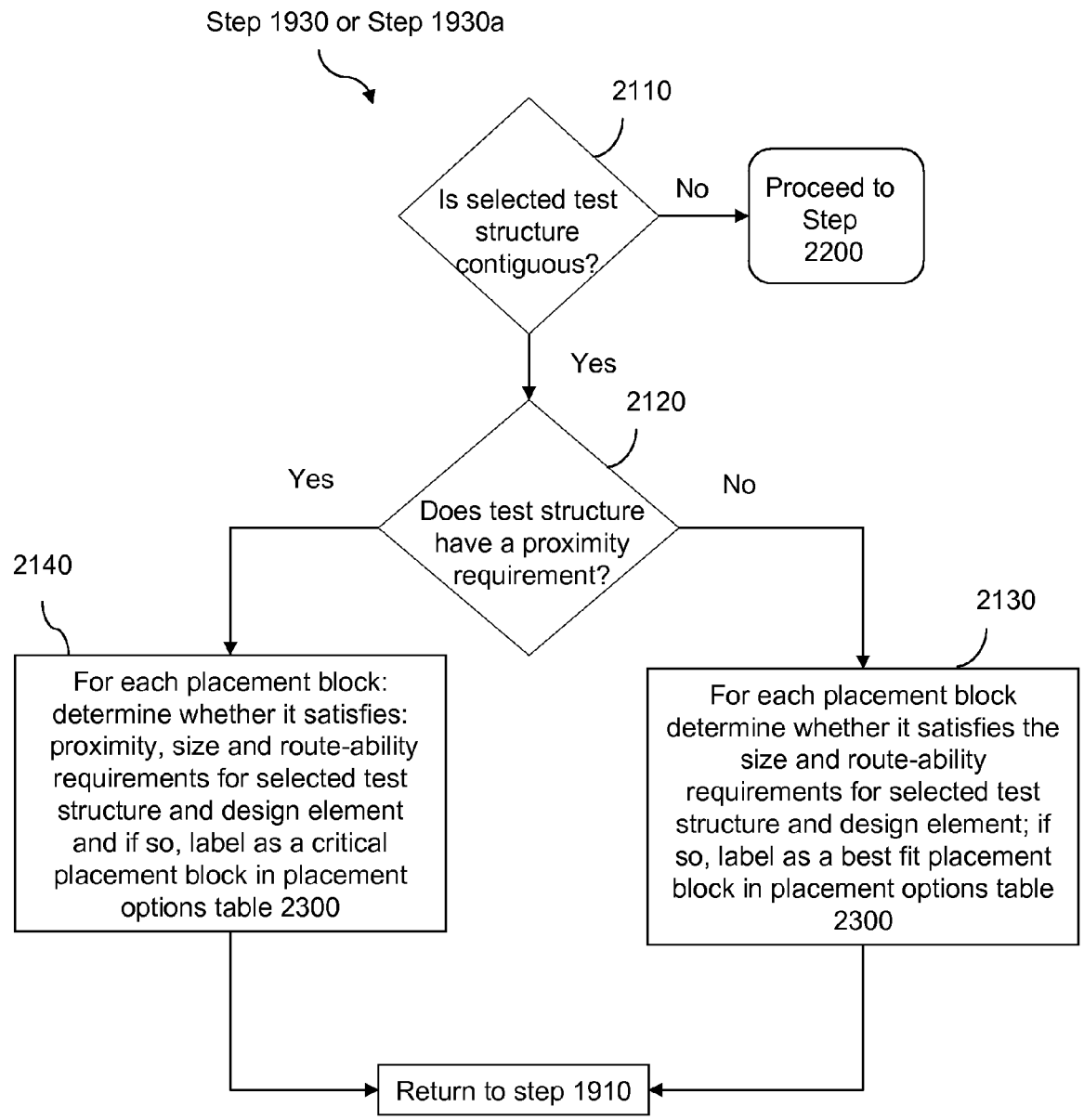
FIG. 21 illustrates a flow diagram further detailing the method of assigning test structures to placement blocks on a chip.

FIG. 21 shows a flow diagram of the details of steps 1930 or 1930a. In step 2110, method 1000 determines whether the selected test structure 100 is contiguous. If yes, method 1000 proceeds to step 2120. If no, method 1000 proceeds to step 2200.

In step 2120, method 1000 determines whether selected test structure 100 has a proximity requirement (typically established in customer directives 1120) to a particular element, logic block, core, macro, etc. If yes, method 1000 proceeds to step 2140, if no, method 1000 proceeds to step 2130.

In step 2130, method 1000 analyzes each placement block 1800 to determine whether it satisfies size and route-ablity requirements for the selected test structure 100 and design element 1200; if yes, method 1000 labels the selected placement block 1800 as a possible placement block 1800 option in placement options table 2300. Method 1000 returns to step 1910.

In step 2140, method 1000 analyzes each placement block 1800 to determine whether it satisfies proximity, size, and route-ability requirements for the selected test structure 100 and design element 1200; if yes, method 1000 labels the selected placement block 1800 as an optimal placement block 1800 option in placement options table 2300. Method 1000 returns to step 1910.

Figure 22:
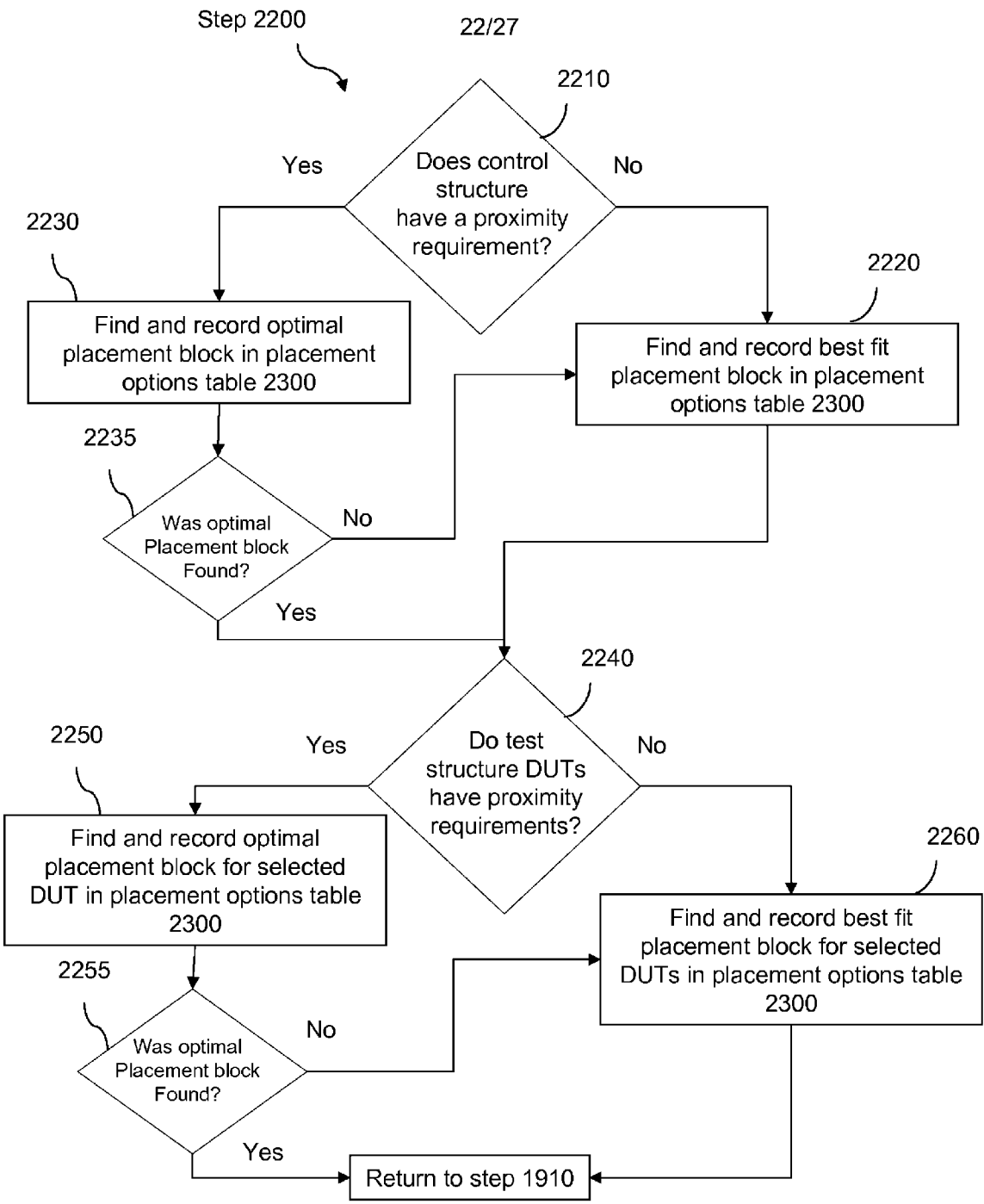
FIG. 22 illustrates a flow diagram of a method of identifying optimal and best fit placement blocks for each of the test structures.

FIG. 22 is a flow diagram of step 2200, which assigns placement block 1800 options to non-contiguous test structures 100. In step 2210 method 1000 determines whether control structure 190 of the selected test structure 100 have a proximity requirement; if yes, method 1000 proceeds to step 2230, if no method 1000 proceeds to step 2220.

In step 2220, method 1000 analyzes each placement block 1800 to determine whether it satisfies size and routeability requirements for selected test structure control structure 190 and selected element 1200; if so, label selected placement block 1800 as a possible placement block 1800' in placement options table 2300. When all placement blocks 1800 have been analyzed, method 1000 proceeds to decision step 2240.

In step 2230, for each placement block 1800, method 1000 analyzes whether it satisfies proximity, size, and route-ability requirements for selected test structure control structure 190 and selected element 1200; if so, label selected placement block 1800 as optimal placement block 1800 in placement options table 2300. When all placement blocks 1800 have been analyzed, method 1000 proceeds to decision step 2235.

In step 2235 method 1000 determines whether an optimal placement block 1800 was found for the selected control structure 190 of test structure 100; if yes method 1000 proceeds to step 2240, if no, method 1000 proceeds to step 2220.

In step 2240, method 1000 determines whether DUTs 170 associated with the selected test structure 100 have proximity requirements; if yes, method 1000 proceeds to step 2250, if no, method 1000 proceeds to step 2260.

In step 2250, for each placement block 1800, method 1000 analyzes whether it satisfies proximity, size, and routeability requirements for selected test structure 100 DUTs 170 and selected element 1200; if so, label selected placement block 1800 as optimal placement block 1800 in placement options table 2300. When all placement blocks 1800 have been analyzed, method 1000 proceeds to step 2255.

In step 2255 method 1000 determines whether an optimal placement block 1800 was found for the selected DUTs 170 of test structure 100; if yes method 1000 returns to step 1910, if no, method 1000 proceeds to step 2260.

In step 2260, method 1000 analyzes each placement block 1800 to determine whether it satisfies size and route-ability requirements for selected DUTs 170 and selected element 1200; if so, label selected placement block 1800 as a best fit possible placement block 1800' in placement options table 2300. When all placement blocks 1800 have been analyzed, method 1000 returns to step 1910.

FIG. 23 shows an example placement options table 2300. For each applicable test structure 100 and each applicable element 1200, the optimal placement blocks 1800 and best fit placement blocks 1800' are recorded in placement options table 2300.

Figure 24:
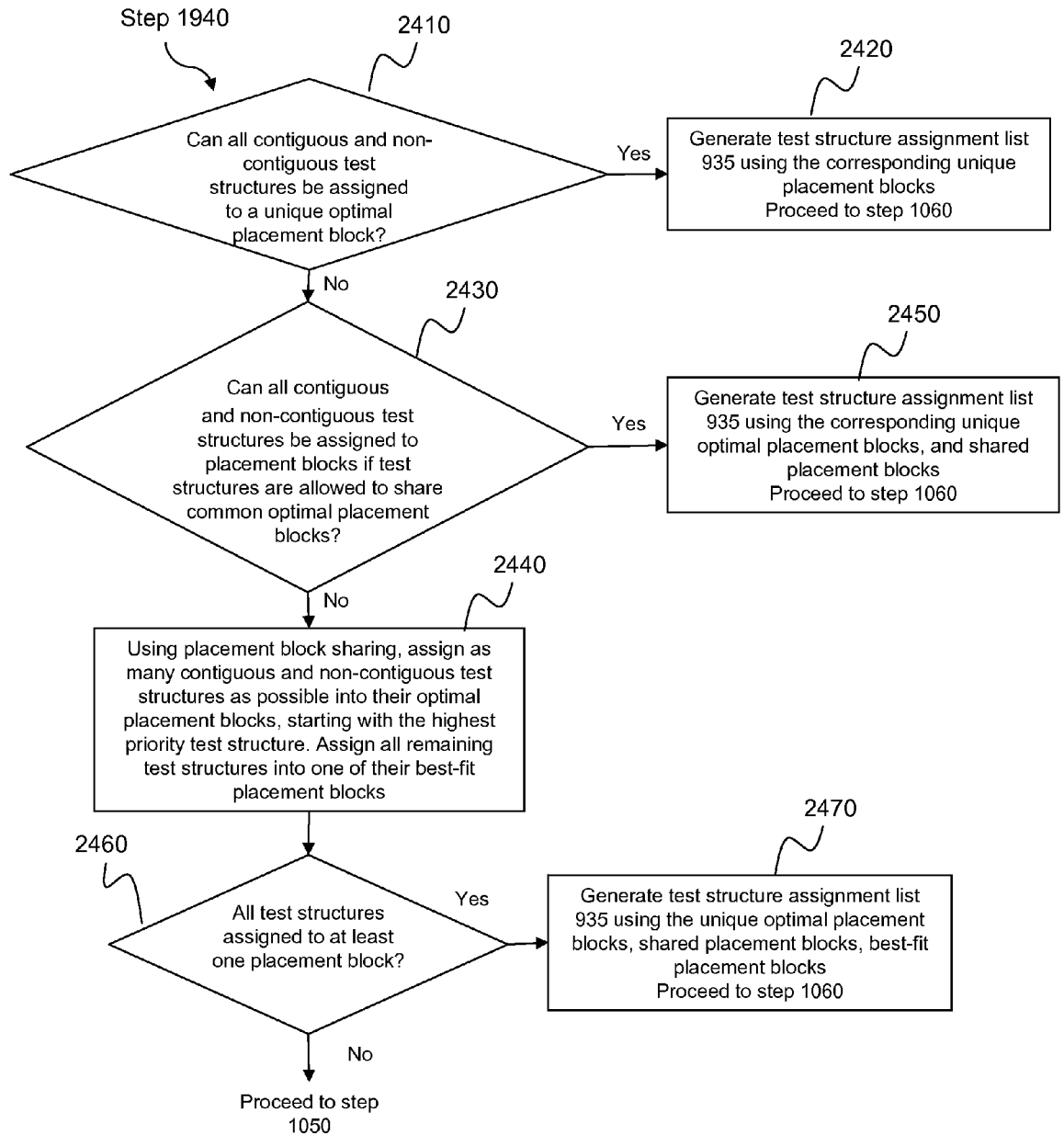
FIG. 24 illustrates a flow diagram of a method of making a final test structure assignment table.

FIG. 24 shows a flow diagram of a detail of step 1940. In decision step 2410, method 1000 determines whether all contiguous and non-contiguous test structures 100 can be assigned to optimal placement blocks 1800; if yes, method 1000 proceeds to step 2420, if no, method 1000 proceeds to step 2430.

In step 2430, method 1000 determines whether all contiguous and non-contiguous test structures be assigned to placement blocks 1800 if test structures 100 are allowed to share common optimal placement blocks 1800. If yes, method 1000 proceeds to step 2450, if no, method 1000 proceeds to step 2440.

In step 2440, method 1000 assigns as many contiguous and non-contiguous test structures 100 as possible into their respective optimal placement blocks 1800 starting with the highest priority test structures 100. All remaining test structures 100 are then assigned to their respective best-fit placement blocks 1800'. Method 1000 proceeds to step 2460.

In step 2460, method 1000 determines whether all test structures 100 are assigned to at least one placement block 1800 or 1800'. If yes, method 1000 proceeds to step 2470, if no, method 1000 proceeds to step 1050 to store DUTs 170 from non-placeable test structures 100 into unused DUTs 945 database.

In step 2420, method 1000 generates test structure assignment list 935 using the corresponding optimal placement blocks 1800 and proceeds to step 1060.

In step 2450, method 1000 generates test structure assignment list 935 using the corresponding optimal placement blocks 1800 and shared placement blocks 1800. Method 1000 proceeds to step 1060.

In step 2470, method 1000 generates test structure assignment list 935 using the optimal placements blocks 1800, shared placement blocks 1800, and best-fit placement blocks 1800'. Method 1000 proceeds to step 1060.

Figure 25:
FIG. 25 is a table of final placement blocks for each of the placeable test structures.

FIG. 25 is an example test structure assignment list 935 for elements 1200*a-c*, Test structures TS3, TS1, DUTs 170*a-d*, TS2, and TS4. In this example the DUTs referenced in TS4 could not be placed and therefore will be stored in unused DUTs 945 database. TS2 will share placement block 1800*b* with TS3, and DUT 170*d* will be tied off (e.g. FET(s) that are in the off position or some other low leakage configuration).

Figure 26:
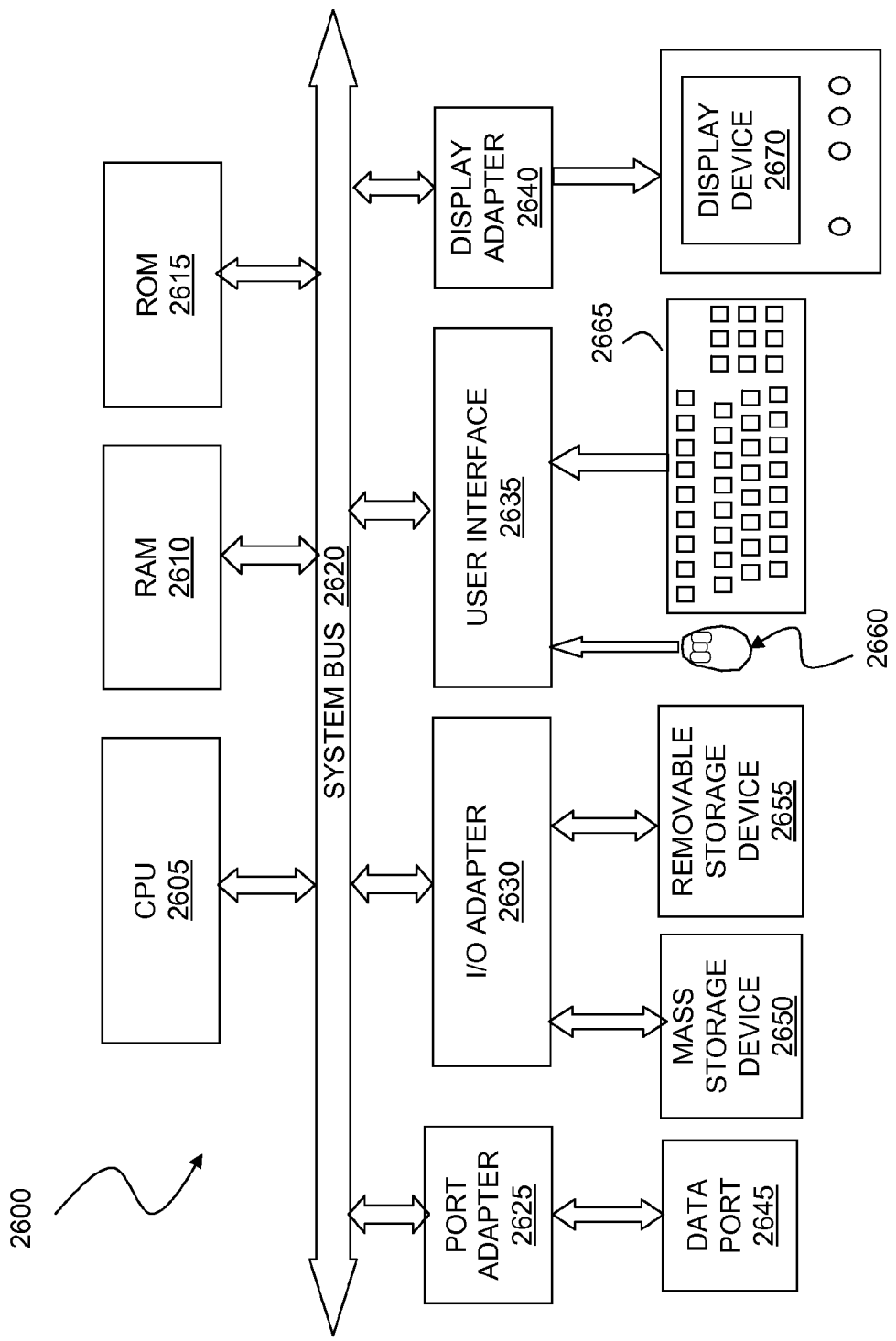
FIG. 26 shows a block diagram of a computer system comprising computer readable media for performing the function of the present invention.

FIG. 26 illustrates a block diagram of a general-purpose computer system which can be used to implement the system and method described herein. The system and method may be coded as a set of instructions on removable or hard media for use by general-purpose computer. FIG. 26 is a schematic block diagram of a general-purpose computer for practicing an embodiment of the present invention. FIG. 26 shows a computer system 2600, which has at least one microprocessor or central processing unit (CPU) 2605. CPU 2605 is interconnected via a system bus 2620 to a random access memory (RAM) 2610, a read-only memory (ROM) 2615, an input/output (I/O) adapter 2630 for connecting a removable and/or program storage device 2655 and a mass data and/or program storage device 2650, a user interface 2635 for connecting a keyboard 2665 and a mouse 2660, a port adapter 2625 for connecting a data port 2645 and a display adapter 2640 for connecting a display device 2670. ROM 2615 contains the basic operating system for computer system 2600. Examples of removable data and/or program storage device 2655 include magnetic media such as floppy drives, tape drives, portable flash drives, zip drives, and optical media such as CD ROM or DVD drives. Examples of mass data and/or program storage device 2650 include hard disk drives and non-volatile memory such as flash memory. In addition to keyboard 2665 and mouse 2660, other user input devices such as trackballs, writing tablets, pressure pads, microphones, light pens and position-sensing screen displays may be connected to user interface 2635. Examples of display device 2670 include cathode-ray tubes (CRT) and liquid crystal displays (LCD).

A computer program may be created by one of skill in the art and stored in computer system 2600 or a data and/or removable program storage device 2665 to simplify the practicing of at least one embodiment of the invention. In operation, information for the computer program created to run the embodiment is loaded on the appropriate removable data and/or program storage device 2655, fed through data port 2645 or entered using keyboard 2665. A user controls the program by manipulating functions performed by the computer program and providing other data inputs via any of the above mentioned data input means. Display device 2670 provides a means for the user to accurately control the computer program and perform the desired tasks described herein.

Figure 27:
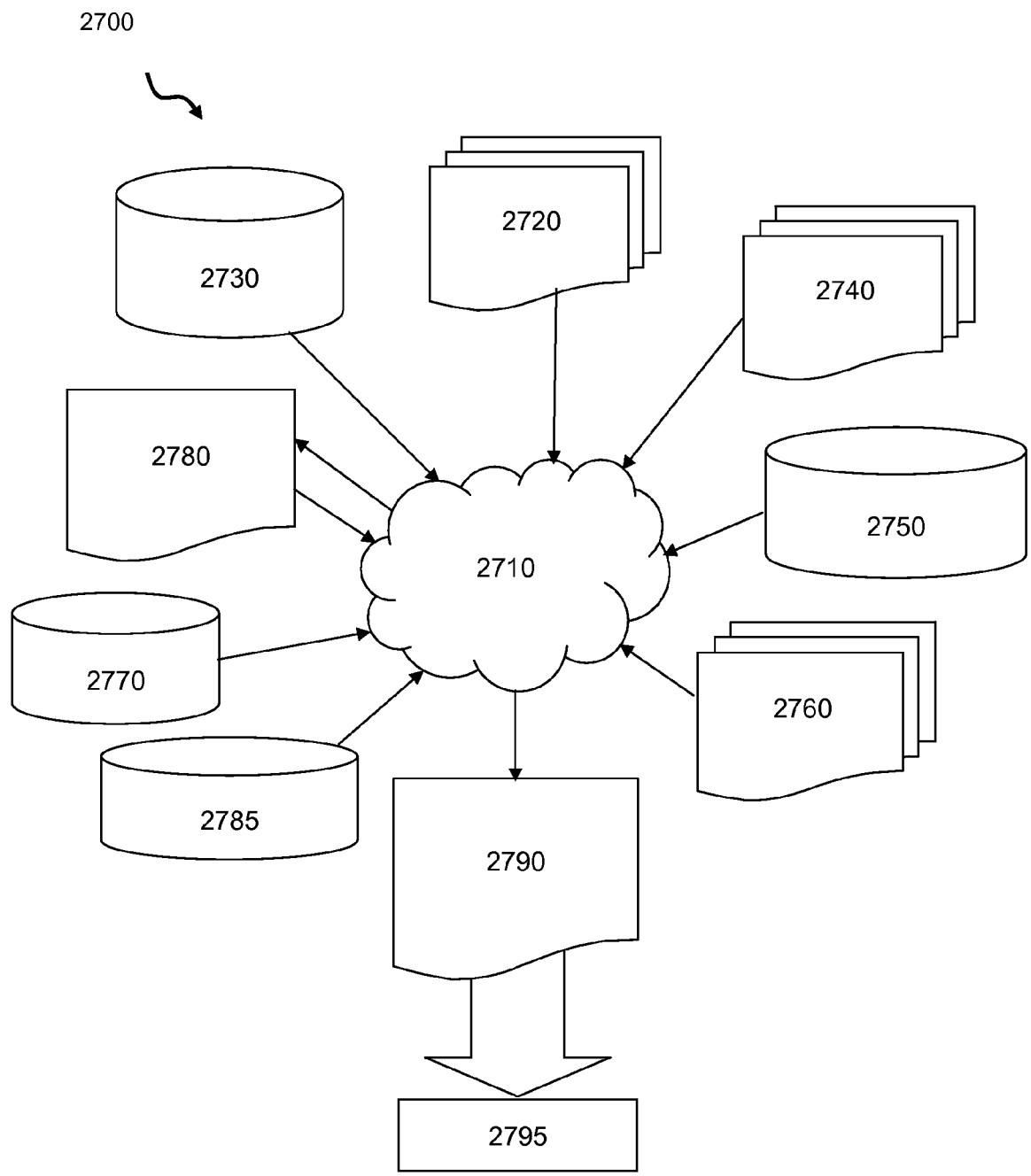
FIG. 27 shows a design flow process implemented by a fabless company such as, for example, Broadcom Corporation, Qualcomm Incorporated, Marvell Technology Group Ltd., etc.

FIG. 27 shows a block diagram of an exemplary design flow 2700 used for example, in semiconductor IC logic design, simulation, test, layout, and manufacture. Design flow 2700 includes processes and mechanisms for processing design structures or devices to generate logically or otherwise functionally equivalent representations of the design structures and/or devices described above and shown in any one or more of FIGS. 1-25. The design structures processed and/or generated by design flow 2700 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Design flow 2700 may vary depending on the type of representation being designed. For example, a design flow 2700 for building an application specific IC (ASIC) may differ from a design flow 2700 for designing a standard component or from a design flow 2700 for instantiating the design into a programmable array, for example a programmable gate array (PGA) or a field programmable gate array (FPGA) offered by Altera® Inc. or Xilinx® Inc.

FIG. 27 illustrates multiple such design structures including an input design structure 2720 that is preferably processed by a design process 2710. Design structure 2720 may be a logical simulation design structure generated and processed by design process 2710 to produce a logically equivalent functional representation of a hardware device. Design structure 2720 may also or alternatively comprise data and/or program instructions that when processed by design process 2710, generate a functional representation of the physical structure of a hardware device. Whether representing functional and/or structural design features, design structure 2720 may be generated using electronic computer-aided design (ECAD) such as implemented by a core developer/designer. When encoded on a machine-readable data transmission, gate array, or storage medium, design structure 2720 may be accessed and processed by one or more hardware and/or software modules within design process 2710 to simulate or otherwise functionally represent an electronic component, circuit, electronic or logic module, apparatus, device, or system such as those shown in any one or more of FIGS. 1-25. As such, design structure 2720 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 2710 preferably employs and incorporates hardware and/or software modules for synthesizing, translating, or otherwise processing a design/simulation functional equivalent of the components, circuits, devices, or logic structures shown in any one or more of FIGS. 1-25 to generate a netlist 2780 which may contain design structures such as design structure 2720. Netlist 2780 may comprise, for example, compiled or otherwise processed data structures representing a list of wires, discrete components, logic gates, control circuits, I/O devices, models, etc. that describes the connections to other elements and circuits in an integrated circuit design. Netlist 2780 may be synthesized using an iterative process in which netlist 2780 is resynthesized one or more times depending on design specifications and parameters for the device. As with other design structure types described herein, netlist 2780 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 2710 may include hardware and software modules for processing a variety of input data structure types including netlist 2780. Such data structure types may reside, for example, within library elements 2730 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 2740, characterization data 2750, verification data 2760, design rules 2770, and test data files 2785 which may include input test patterns, output test results, and other testing information. Design process 2710 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 2710 without deviating from the scope and spirit of the invention. Design process 2710 may also include modules for performing standard circuit design processes such as timing analysis, verification, design rule checking, place and route operations, etc.

Design process 2710 employs and incorporates logic and physical design tools such as HDL compilers and simulation model build tools to process design structure 2720 together with some or all of the depicted supporting data structures along with any additional mechanical design or data (if applicable), to generate a second design structure 2790. Design structure 2790 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 2720, design structure 2790 preferably comprises one or more files, data structures, or other computer-encoded data or instructions that reside on transmission or data storage media and that when processed by an ECAD system generate a logically or otherwise functionally equivalent form of one or more of the embodiments of the invention shown in any one or more of FIGS. 1-25. In one embodiment, design structure 2790 may comprise a compiled, executable HDL simulation model that functionally simulates the devices shown in any one or more of FIGS. 1-25.

Design structure 2790 may also employ a data format used for the exchange of layout data of integrated circuits and/or symbolic data format (e.g. information stored in a GDSII (GDS2), GL1, OASIS, map files, or any other suitable format for storing such design data structures). Design structure 2790 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in any one or more of FIGS. 1-25. Design structure 2790 may then proceed to a stage 2795 where, for example, design structure 2790: proceeds to tape-out, is released to manufacturing, is released to a mask house, is sent to another design house, is sent back to the customer, etc.

The above description and drawings are only to be considered illustrative of exemplary embodiments, which achieve the features and advantages of the invention. It should be appreciated by one of ordinary skill in the art that modification and substitutions to specific layout designs, systems for performing the tests and analysis, and the devices themselves can be made without departing from the spirit and scope of the invention. Accordingly, the invention is not to be considered as being limited by the foregoing embodiments, description and drawings.

What is claimed is:

1. A hardware description language (HDL) design structure encoded on a machine-readable data storage medium, said HDL design structure comprising elements that when processed in a computer-aided design system generates a machine-executable representation of a test structure, wherein said HDL design structure comprises:

an IC design comprising at least one device and at least one element;

a library comprising at least one device under test (DUT), wherein the at least one DUT matches the at least one device; and a modified IC design comprising at least one control structure, the control structure coupled to the at least one DUT and the at least one element.

2. The HDL design structure of claim 1 further comprising:

a first list comprising a plurality of matching DUTs.

3. The HDL design structure of claim 2, further comprising:

a second list generated from the first list and a first database comprising priority specifications;

the second list comprising a plurality of prioritized matching DUTs.

4. The HDL design structure of claim 3, wherein the first database comprises at least one of a plurality of customer directives, a plurality of historical data, or a plurality of internal rules.

5. The HDL design structure of claim 3 further comprising:

at least one placement algorithm for placing at least one of the plurality of prioritized matching DUTs into the IC design.

6. The HDL design structure of claim 3 further comprising:

a third list comprising at least a portion of the plurality of prioritized matching DUTs corresponding to a plurality of elements, the third list is generated from the second list and a second database comprising the plurality of elements, the elements corresponding to the IC design.

7. The HDL design structure of claim 6 further comprising a third database, the third database comprising at least a second portion prioritized matching DUTs which are not in the third list.

8. The HDL design structure of claim 1, wherein the HDL design structure comprises a netlist.

9. The HDL design structure of claim 1, wherein the HDL design structure resides on storage medium as a data format used for the exchange of layout data of integrated circuits.

10. The HDL design structure of claim 1, wherein the design structure resides in a programmable gate array.

* * * * *